United States Patent
Oliver et al.

(10) Patent No.: US 7,899,658 B2
(45) Date of Patent: Mar. 1, 2011

(54) METHOD FOR EVALUATING AND IMPROVING DRILLING OPERATIONS

(75) Inventors: Stuart Oliver, Magnolia, TX (US); Sujian J. Huang, Beijing (CN); Luis C. Paez, The Woodlands, TX (US); Halle Aslaksen, Neu Isenburg (DE)

(73) Assignee: Smith International, Inc., Houston, TX (US)

( * ) Notice: Subject to any disclaimer, the term of this patent is extended or adjusted under 35 U.S.C. 154(b) by 895 days.

(21) Appl. No.: 11/365,065

(22) Filed: Feb. 28, 2006

(65) Prior Publication Data

US 2006/0149518 A1 Jul. 6, 2006

Related U.S. Application Data

(63) Continuation of application No. 10/851,677, filed on May 21, 2004, now Pat. No. 7,020,597, which is a continuation-in-part of application No. 09/689,299, filed on Oct. 11, 2000, now Pat. No. 6,785,641.

(51) Int. Cl.
G06G 7/48 (2006.01)
(52) U.S. Cl. ........................................... 703/10
(58) Field of Classification Search ............. 703/2, 6–7, 703/10; 175/331, 375
See application file for complete search history.

(56) References Cited

U.S. PATENT DOCUMENTS

| 1,209,299 | A | 12/1916 | Hughes |
| 1,263,802 | A | 4/1918 | Reed |
| 1,394,769 | A | 10/1921 | Sorensen |
| 4,408,671 | A | 10/1983 | Munson |
| 4,475,606 | A | 10/1984 | Crow |
| 4,815,342 | A | 3/1989 | Brett et al. |
| 4,862,974 | A | 9/1989 | Warren |
| 4,932,484 | A | 6/1990 | Warren |
| 4,982,802 | A | 1/1991 | Brett et al. |
| 5,010,789 | A | 4/1991 | Brett |
| 5,042,596 | A | 8/1991 | Brett |
| 5,131,478 | A | 7/1992 | Brett |
| 5,178,222 | A | 1/1993 | Jones |
| RE34,435 | E | 11/1993 | Warren et al. |
| 5,456,141 | A | 10/1995 | Ho |
| 5,605,198 | A | 2/1997 | Tibbitts |

(Continued)

FOREIGN PATENT DOCUMENTS

BE 1013217 A6 10/2001

(Continued)

OTHER PUBLICATIONS

Brakel et al.; Prediction of Wellbore trajectory considering bottomhole assembly and drill-bit dynamics; SPE Drilling Engineering; Jun. 1989; pp. 109-118.*

(Continued)

*Primary Examiner* — Hugh Jones
(74) *Attorney, Agent, or Firm* — Osha Liang LLP

(57) ABSTRACT

A method for improving drilling performance of a drilling tool assembly is disclosed. The method includes identifying a drilling performance parameter to be improved. One or more potential solutions are defined to improve the drilling performance parameter. A drilling simulation is performed to determine the dynamic response of the drilling tool assembly during a drilling operation. Determining the dynamic response includes determining the interaction of a cutting element of a drill bit with an earth formation. Improvement in the drilling performance parameter is determined based upon the drilling simulation.

20 Claims, 19 Drawing Sheets

| Drilldepth (ft) | Dir Ang (deg) | Inc Ang (deg) | WalkRate (deg/100ft) | BUR (deg/100ft) | Dogleg (deg/100ft) |
|---|---|---|---|---|---|
| 4300 | 112 | 3.6 | 0 | 0.01 | 0.01 |
| 4310 | 112 | 3.64 | 0.05 | 0.39 | 0.39 |
| 4320 | 112.01 | 3.68 | 0.01 | 0.4 | 0.4 |
| 4330 | 112 | 3.72 | -0.01 | 0.4 | 0.4 |
| 4340 | 112 | 3.76 | 0 | 0.4 | 0.4 |
| 4350 | 112 | 3.8 | 0 | 0.4 | 0.4 |
| 4360 | 112 | 3.84 | -0.02 | 0.4 | 0.4 |
| 4370 | 112 | 3.88 | 0 | 0.4 | 0.4 |
| 4380 | 112 | 3.92 | 0 | 0.4 | 0.4 |
| 4390 | 112 | 3.96 | 0.01 | 0.4 | 0.4 |
| 4400 | 112 | 4 | -0.03 | 0.4 | 0.4 |

U.S. PATENT DOCUMENTS

| | | | |
|---|---|---|---|
| 5,613,093 A | 3/1997 | Kolb | |
| 5,787,022 A | 7/1998 | Tibbitts et al. | |
| 5,794,720 A | 8/1998 | Smith et al. | |
| 5,803,196 A | 9/1998 | Fielder | |
| 5,864,058 A | 1/1999 | Chen | |
| 5,868,213 A | 2/1999 | Cisneros et al. | |
| 5,903,743 A | 5/1999 | Kolb | |
| 5,950,747 A | 9/1999 | Tibbitts et al. | |
| 6,021,377 A | 2/2000 | Dubinsky et al. | |
| 6,021,859 A | 2/2000 | Tibbitts | |
| 6,095,262 A | 8/2000 | Chen | |
| 6,109,368 A | 8/2000 | Goldman et al. | |
| 6,131,673 A | 10/2000 | Goldman et al. | |
| 6,213,225 B1* | 4/2001 | Chen | 175/57 |
| 6,241,034 B1 | 6/2001 | Steinke et al. | |
| 6,269,893 B1 | 8/2001 | Beaton | |
| 6,290,006 B1 | 9/2001 | Crawford | |
| 6,298,930 B1 | 10/2001 | Sinor | |
| 6,349,595 B1 | 2/2002 | Civolani et al. | |
| 6,374,926 B1 | 4/2002 | Goldman et al. | |
| 6,386,297 B1 | 5/2002 | Cooley et al. | |
| 6,401,839 B1 | 6/2002 | Chen | |
| 6,408,953 B1 | 6/2002 | Goldman et al. | |
| 6,412,577 B1 | 7/2002 | Chen | |
| 6,424,919 B1 | 7/2002 | Moran et al. | |
| 6,435,058 B1 | 8/2002 | Matthias | |
| 6,516,293 B1 | 2/2003 | Huang et al. | |
| 6,536,543 B2 | 3/2003 | Meiners | |
| 6,612,382 B2 | 9/2003 | King | |
| 6,695,073 B2 | 2/2004 | Glass | |
| 6,711,969 B2 | 3/2004 | Meiners | |
| 6,729,420 B2 | 5/2004 | Mensa-Wilmot | |
| 6,785,641 B1 | 8/2004 | Huang | |
| 6,873,947 B1 | 3/2005 | Huang et al. | |
| 7,261,167 B2 | 8/2007 | Goldman et al. | |
| 2001/0042642 A1 | 11/2001 | King | |
| 2003/0015351 A1 | 1/2003 | Goldman et al. | |
| 2003/0187582 A1 | 10/2003 | Goldman et al. | |
| 2003/0196835 A1 | 10/2003 | Singh et al. | |
| 2004/0000430 A1 | 1/2004 | King | |
| 2004/0059554 A1 | 3/2004 | Goldman et al. | |
| 2004/0143427 A1 | 7/2004 | Huang | |
| 2004/0182606 A1 | 9/2004 | Goldman et al. | |
| 2004/0211596 A1 | 10/2004 | Huang | |
| 2005/0010382 A1 | 1/2005 | Oliver | |
| 2005/0096847 A1 | 5/2005 | Huang | |
| 2005/0133272 A1 | 6/2005 | Huang | |
| 2005/0149306 A1 | 7/2005 | King | |

FOREIGN PATENT DOCUMENTS

| | | |
|---|---|---|
| EP | 0728912 A2 | 8/1996 |
| EP | 0972908 A2 | 1/2000 |
| EP | 1046781A1 A1 | 10/2000 |
| EP | 1146200 A1 | 10/2001 |
| GB | 2241266 A | 8/1991 |
| GB | 2300208 A | 10/1996 |
| GB | 2339815 A | 2/2000 |
| GB | 2346628 A | 8/2000 |
| GB | 2 360 304 A | 9/2001 |
| GB | 2363146 A | 12/2001 |
| GB | 2 367 843 B | 4/2002 |
| GB | 2367843 A | 4/2002 |
| GB | 2379699 A | 3/2003 |
| SU | 295857 | 4/1971 |
| SU | 398733 | 2/1974 |
| SU | 420749 | 9/1974 |
| SU | 436147 | 12/1974 |
| SU | 515867 | 7/1975 |
| SU | 933932 A1 | 6/1982 |
| SU | 1461855 A1 A1 | 2/1989 |
| SU | 1654515 A1 A1 | 7/1991 |
| SU | 1691497 A1 A1 | 11/1991 |
| WO | WO-97/36084 | 10/1997 |
| WO | WO-00/12859 | 3/2000 |
| WO | WO-00/12860 | 3/2000 |
| WO | WO-01/02832 A1 | 1/2001 |
| WO | WO-01/33027 A2 | 5/2001 |
| WO | WO-02/077407 A1 | 10/2002 |

OTHER PUBLICATIONS

U.S. Office Action issued in corresponding U.S. Appl. No. 10/852,574; Dated Jun. 7, 2006; 10 pages.

Certification and Notarization dated Nov. 12, 2003 from Universe Technical Translation for English Translations of SU-933932; SU-295857; SU-398733; SU-420749; SU-229371; SU-436147; and SU-515867 (1 page).

D. Ma, et al. "Dynamics of Roller Cone Bits", Journal of Energy Resources Technology, Dec. 1985, vol. 107 (pp. 543-548).

D. Ma, et al. "A New Way to Characterize the Gouging-Scraping Action of Roller Cone Bits", Society of Petroleum Engineers, 1989 (24 pgs).

Boris L. Steklianov, "Increasing the Efficiency of Rock-Cutting Tools on the Basis of Comparative Analysis of the Kinetic Characteristics of Their Cutting Structure"; NDERI, 1990 (24 pages).

RockBit International, "The Leader in High-Speed Drill Bit Technology" (24 pages).

Sandvik Rock Bits, "Sandvik in the World of Oil and Gas" (8 pages).

B. L. Steklyanov, et al.; "Improving the effectiveness of Drilling Tools"; KhM-3 Oil Industry Machine Building; (1991) pp. 1-35.

Dekun Ma, et al.; "The Computer Simulation of the Interaction Between Roller Bit and Rock"; International Meeting on Petroleum Engineering; PR China; Nov. 14-17, 1995; pp. 309-317.

Ma Dekun, et al., "The Operational Mechanics of The Rock Bit", Petroleum Industry Press, 1996, pp. 1-243.

Society of Petroleum Engineers Paper No. 56439, "Field Investigation of the Effects of Stick-Slip, Lateral, and Whirl Vibrations on Roller Cone Bit Performance", S.L. Chen, et al., presented Oct. 3-6, 1999, (10 pages).

Society of Petroleum Engineers Paper No. 71053, "Development and Application of a New Roller Cone Bit with Optimized Tooth Orientation", S. L. Chen, et al., presented May 21-23, 2001 (15 pages).

Society of Petroleum Engineers Paper No. 71393, "Development and Field Applications of Roller Cone Bits with Balanced Cutting Structure", S. L. Chen, et al., presented Sep. 30-Oct. 3, 2001 (11 pages).

Hancke, et al., G.P. A Control System for Optimizing Deep Hole Drilling Conditions, IECON 1991 International Conference on Industrial Electrionics, Control and Instrumentation, 1991, pp. 2279-2284.

Ertunc, et al., H. M. Real Time Monitoring of Tool Wear Using Multiple Modeling Method, IEEE International Electric Machines and Drives Conference, IEMDC 2001, pp. 687-691.

Hancke, G. P. The Effective Control of a Deep Hole Diamond Drill, Conference REcord of the IEEE Industry Applications Society Annual Meeting, 1991, pp. 1200-1205.

Howie, et al., W. L. A Smart Bolter for Improving Entry Stability, Conference Record of the IEEE Industry Applications Society Annual Meeting, 1989, pp. 1556-1564.

United Kingdom Combined Search and Examination Report dated Aug. 9, 2005 (6 pages).

Burgess, T.M. & Lesso, Jr., W.G.; Measuring the Wear of Milled Tooth Bits Using MWD Torque and Weight-on-Bit; SPE/IADC 13475 (10 pages).

Reynolds, W.W.; Economic Analysis of Drilling Plans and Contractors by Use of a Drilling Systems Approach; SPE 13466 (pp. 787-793).

Technical Toolboxes, "DDC Drillstring Vibration Model"; Jun. 4, 2004 (11 pages).

Examiner's Search Report dated Jan. 25, 2002, 3 pages.

Yu Wang and Matthew T.Mason, "Two-Dimensional Rigid-Body Collisions with Friction", Journal of Applied Mechanics, Sep. 1992, vol. 59, pp. 635 through 642.

T.M. Warren and W.K. Armagost, "Laboratory Drilling Performance of PDC Bits", Society of Petroleum Engineers, 61st Annual Technical Conference and Exhibition held in New Orleans, LA, Oct. 5-8, 1986, SPE 15617.

T.M. Warren and A. Sinor, "Drag Bit Performance Modeling", Society of Petroleum Engineers, 61st Annual Technical Conference and Exhibition held in New Orleans, LA, Oct. 5-8, 1986, SPE 15618.

R.K. Dropek, et al. "A Study to Determine Roller Cone Cutter Offset Effects at Various Drilling Depths", ASME, vol. 78-Pet-23, pp. 1-8, Jul. 21, 1978.

Ramsundar, Doodnath, "Bit Deviation Forces Due to Rock-Bit Interaction" University of Tulsa, .pp. 1-119, 1976.

English Translation of Description of Invention No. SU-1691497 dated Nov. 15, 1994 (4 pages).

English Translation of Description of Invention No. SU-1654515 dated Jul. 7, 1991 (4 pages).

English Translation of Description of Invention No. SU-1461855 dated Feb. 28, 1999 (3 pages).

English Translation of Description of Invention No. SU-933932 dated Jun. 7, 1982 (2 pages).

English Translation of Description of Invention No. SU-295857 dated Apr. 14, 1971 (2 pages).

English Translation of Description of Invention No. SU-398733 dated Feb. 9, 1974 (2 pages).

English Translation of Description of Invention No. SU-420749 dated Sep. 2, 1974 (2 pages).

English Translation of Description of Invention No. SU-229371 dated Feb. 26, 1968 (1 page).

English Translation of Description of Invention No. SU-436147 dated Dec. 9, 1974 (2 pages).

English Translation of Description of Invention No. SU-515867 dated Jul. 12, 1975 (2 pages).

U.S. Non-Final Office Action dated Apr. 3, 2008 for corresponding Application No. 11/557,296, (15 pages).

U.S. Non-Final Office Action dated Apr. 17, 2009, for related U.S. Appl. No. 11/137,713, (21 pages).

Non-Final Office Action for related U.S. Appl. No. 11/495,149 dated Oct. 8, 2009. (20 Pages).

"Drilling Index—a New Approach to Bit Performance", Perrin et al. SPE/IADC Drilling Conference Mar. 4-6, 1997. Amsterdam, Netherlands (7 pages).

Office Action for related U.S. Appl. No. 10/888,446 dated Nov. 3, 2009. (13 pages).

Office Action issued in U.S. Appl. No. 10/888,446 dated May 10, 2010 (20 pages).

* cited by examiner

FIG. 5

Well Parameter Setup

Well survey data
- Measure Depth (ft): 0.000
- Inclination (deg): 0.00
- Azimuth (deg): 0.00

Wellbore data
- Diameter (in): 12.2500
- Well Stiff (lb/in): 100000.0
- Cf; Restitution: 0.950
- Axial D. Cffric: 0.0500
- Transverse D. Cffric: 0.2000
- Axial S. Cffric: 0.2000
- Transverse S. Cffric: 0.2000
- Mud density (lbf/gal): 12.9000

Total: 8,648.00 (ft)

| Depth (ft) | Incl. (Deg) | Azimuth (Deg) | Diam. (in) | Well Stiff (lbf/in) | Rest. coef | Axial.F.D. coef | Trans.F.D. coef | Axial.F.S. coef | Trans.F.S. coef |
|---|---|---|---|---|---|---|---|---|---|
| 0.000 | 0.00 | 0.00 | 12.250 | 1.000e+05 | 0.950 | 0.0500 | 0.2000 | 0.2000 | 0.2000 |
| 3048.000 | 0.30 | 0.00 | 12.3470 | 1.000e+05 | 0.950 | 0.0500 | 0.2000 | 0.2000 | 0.2000 |
| 8648.000 | 0.30 | 0.00 | 12.2500 | 1.000e+05 | 0.950 | 0.0500 | 0.2000 | 0.2000 | 0.2000 |

[Add] [Del]
[Show 3D Well]

[Ok] [Cancel]

*FIG. 6*

510 { Well survey data
Measure Depth (ft) [4400.000]   Inclination (deg) [4.00]
Azimuth (deg) [112.00]

511 { Wellbore data
Diameter (in) [16.0000]   Well Stiff (lb/in) [100000.0]
Cf; Restitution [0.950]   Axial D. Cffric [0.0500]
Transverse D. Cffric [0.2000]   Axial S. Cffric [0.2000]
Transverse S. Cffric [0.2000]   Mud density (lbf/gal) [10.0000]

Total: 1,900.00 (ft)

| Depth (ft) | Incl. (Deg) | Azimuth (Deg) | Diam. (in) | Well Stiff (lbf/in) | Rest. coef | Axial.F.D. coef | Trans.F.D. coef | Axial.F.S. coef |
|---|---|---|---|---|---|---|---|---|
| 4000.000 | 2.60 | 112.00 | 16.000 | 1.000e+05 | 0.950 | 0.0500 | 0.2000 | 0.2000 |
| 4100.000 | 2.80 | 112.00 | 16.000 | 1.000e+05 | 0.950 | 0.0500 | 0.2000 | 0.2000 |
| 4200.000 | 3.20 | 112.00 | 16.000 | 1.000e+05 | 0.950 | 0.0500 | 0.2000 | 0.2000 |
| 4300.000 | 3.60 | 112.00 | 16.000 | 1.000e+05 | 0.950 | 0.0500 | 0.2000 | 0.2000 |
| 4400.000 | 4.00 | 112.00 | 16.000 | 1.000e+05 | 0.950 | 0.0500 | 0.2000 | 0.2000 |

| Drilldepth (ft) | Dir Ang (deg) | Inc Ang (deg) | WalkRate (deg/100ft) | BUR (deg/100ft) | Dogleg (deg/100ft) |
|---|---|---|---|---|---|
| 4300 | 112 | 3.6 | 0 | 0.01 | 0.01 |
| 4310 | 112 | 3.64 | 0.05 | 0.39 | 0.39 |
| 4320 | 112.01 | 3.68 | 0.01 | 0.4 | 0.4 |
| 4330 | 112 | 3.72 | -0.01 | 0.4 | 0.4 |
| 4340 | 112 | 3.76 | 0 | 0.4 | 0.4 |
| 4350 | 112 | 3.8 | 0 | 0.4 | 0.4 |
| 4360 | 112 | 3.84 | -0.02 | 0.4 | 0.4 |
| 4370 | 112 | 3.88 | 0 | 0.4 | 0.4 |
| 4380 | 112 | 3.92 | 0 | 0.4 | 0.4 |
| 4390 | 112 | 3.96 | 0.01 | 0.4 | 0.4 |
| 4400 | 112 | 4 | -0.03 | 0.4 | 0.4 |

METHOD FOR EVALUATING AND IMPROVING DRILLING OPERATIONS

CROSS-REFERENCE TO RELATED APPLICATIONS

This application is a continuation-in-part of U.S. patent application Ser. No. 09/689,299, filed on Oct. 11, 2000, and claims the benefit, pursuant to 35 U.S.C. § 120, of that application. That application is incorporated by reference in its entirety.

BACKGROUND OF INVENTION

FIG. 1 shows one example of a conventional drilling system for drilling an earth formation. The drilling system includes a drilling rig 10 used to turn a drilling tool assembly 12 that extends downward into a well bore 14. The drilling tool assembly 12 includes a drilling string 16, and a bottomhole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases the drill string 16 further includes additional components such as subs, pup joints, etc.

The BHA 18 includes at least a drill bit 20. Typical BHA's may also include additional components attached between the drill string 16 and the drill bit 20. Examples of additional BHA components include drill collars, stabilizers, measurement-while-drilling (MWD) tools, logging-while-drilling (LWD) tools, subs, hole enlargement devices (e.g., hole openers and reamers), jars, accelerators, thrusters, downhole motors, and rotary steerable systems.

In general, drilling tool assemblies 12 may include other drilling components and accessories, such as special valves, such as kelly cocks, blowout preventers, and safety valves. Additional components included in a drilling tool assembly 12 may be considered a part of the drill string 16 or a part of the BHA 18 depending on their locations in the drilling tool assembly 12.

The drill bit 20 in the BHA 18 may be any type of drill bit suitable for drilling earth formation. Two common types of drill bits used for drilling earth formations are fixed-cutter (or fixed-head) bits and roller cone bits. FIG. 2 shows one example of a fixed-cutter bit. FIG. 3 shows one example of a roller cone bit.

Referring to FIG. 2, fixed-cutter bits (also called drag bits) 21 typically comprise a bit body 22 having a threaded connection at one end 24 and a cutting head 26 formed at the other end. The head 26 of the fixed-cutter bit 21 typically includes a plurality of ribs or blades 28 arranged about the rotational axis of the drill bit and extending radially outward from the bit body 22. Cutting elements 29 are embedded in the raised ribs 28 to cut formation as the drill bit is rotated on a bottom surface of a well bore. Cutting elements 29 of fixed-cutter bits typically comprise polycrystalline diamond compacts (PDC) or specially manufactured diamond cutters. These drill bits are also referred to as PDC bits.

Referring to FIG. 3, roller cone bits 30 typically comprise a bit body 32 having a threaded connection at one end 34 and one or more legs (typically three) extending from the other end. A roller cone 36 is mounted on each leg and is able to rotate with respect to the bit body 32. On each cone 36 of the drill bit 30 are a plurality of cutting elements 38, typically arranged in rows about the surface of the cone 36 to contact and cut through formation encountered by the drill bit. Roller cone bits 30 are designed such that as a drill bit rotates, the cones 36 of the roller cone bit 30 roll on the bottom surface of the well bore (called the "bottomhole") and the cutting elements 38 scrape and crush the formation beneath them. In some cases, the cutting elements 38 on the roller cone bit 30 comprise milled steel teeth formed on the surface of the cones 36. In other cases, the cutting elements 38 comprise inserts embedded in the cones. Typically, these inserts are tungsten carbide inserts or polycrystalline diamond compacts. In some cases hardfacing is applied to the surface of the cutting elements and/or cones to improve wear resistance of the cutting structure.

For a drill bit 20 to drill through formation, sufficient rotational moment and axial force must be applied to the drill bit 20 to cause the cutting elements of the drill bit 20 to cut into and/or crush formation as the drill bit is rotated. The axial force applied on the drill bit 20 is typically referred to as the "weight on bit" (WOB). The rotational moment applied to the drilling tool assembly 12 at the drill rig 10 (usually by a rotary table or a top drive mechanism) to turn the drilling tool assembly 12 is referred to as the "rotary torque". The speed at which the rotary table rotates the drilling tool assembly 12, typically measured in revolutions per minute (RPM), is referred to as the "rotary speed". Additionally, the portion of the weight of the drilling tool assembly supported at the rig 10 by the suspending mechanism (or hook) is typically referred to as the hook load.

During drilling, the actual WOB is not constant. Some of the fluctuation in the force applied to the drill bit may be the result of the drill bit contacting with formation having harder and softer portions that break unevenly. However, in most cases, the majority of the fluctuation in the WOB can be attributed to drilling tool assembly vibrations. Drilling tool assemblies can extend more than a mile in length while being less than a foot in diameter. As a result, these assemblies are relatively flexible along their length and may vibrate when driven rotationally by the rotary table. Drilling tool assembly vibrations may also result from vibration of the drill bit during drilling. Several modes of vibration are possible for drilling tool assemblies. In general, drilling tool assemblies may experience torsional, axial, and lateral vibrations. Although partial damping of vibration may result due to viscosity of drilling fluid, friction of the drill pipe rubbing against the wall of the well bore, energy absorbed in drilling the formation, and drilling tool assembly impacting with well bore wall, these sources of damping are typically not enough to suppress vibrations completely.

Vibrations of a drilling tool assembly are difficult to predict because different forces may combine to produce the various modes of vibration, and models for simulating the response of an entire drilling tool assembly including a drill bit interacting with formation in a drilling environment have not been available. Drilling tool assembly vibrations are generally undesirable, not only because they are difficult to predict, but also because the vibrations can significantly affect the instantaneous force applied on the drill bit. This can result in the drill bit not operating as expected. For example, vibrations can result in off-centered drilling, slower rates of penetration, excessive wear of the cutting elements, or premature failure of the cutting elements and the drill bit. Lateral vibration of the drilling tool assembly may be a result of radial force imbalances, mass imbalance, and drill bit/formation interaction, among other things. Lateral vibration results in poor drilling tool assembly performance, overage hole drilling, out-of-round, or "lobed" well bores and premature failure of both the cutting elements and drill bit bearings.

When the drill bit wears out or breaks during drilling, the entire drilling tool assembly must be lifted out of the well bore section-by-section and disassembled in an operation called a "pipe trip". In this operation, a heavy hoist is required to pull the drilling tool assembly out of the well bore in stages so that each stand of pipe (typically pipe sections of about 90 feet) can be unscrewed and racked for the later re-assembly. Because the length of a drilling tool assembly may extend for more than a mile, pipe trips can take several hours and can pose a significant expense to the well bore operator and drilling budget. Therefore, the ability to design drilling tool assemblies which have increased durability and longevity, for example, by minimizing the wear on the drilling tool assembly due to vibrations, is very important and greatly desired to minimize pipe trips out of the well bore and to more accurately predict the resulting geometry of the well bore drilled.

Many companies offer drilling services for the purposes of improving drilling performance. These services typically include modeling up to around 200 feet of the BHA with representative factors assumed for the influence of the drill string and the drill bit during drilling. The drill string is typically modeled as a spring and the spring constant assumed based on the expected configuration of the drill string. The BHA is typically modeled as a beam suspended from the spring at one end and excited by an excitation at the other end assumed to represent the excitation resulting from a drill bit interacting with the formation.

While prior art simulation methods, such as those described above provide a general means for predicting drilling tool assembly dynamics, simulation techniques have not been developed to cover actual drilling with a drilling tool assembly in a well bore including a complete simulation of the drill string, the BHA, and the drill bit that takes into account the interaction of the cutting elements on the drill bit with the earth formation being drilled. As a result, accurately modeling and predicting the response of a drilling tool assembly during drilling has been virtually impossible. Additionally, the change in the dynamic response of a drilling tool assembly while drilling when a component of the drilling tool assembly is changed has not been well understood.

Prior art drill bit simulation methods have been developed and used for the design or selection of drill bits independent of the drilling tool assemblies with which the drill bits will be used. As a result, optimized drill bit selection and design is typically an iterative process, which requires the collection and evaluation of field performance data obtained from many field runs using a selected drill bit. When a trend of drilling problems is found to occur for a particular bit, such as low rate of penetration or premature drill bit failure, a new drill bit may be selected or an adjustment made to the current bit design in hopes of obtaining better drilling performance in future runs. A design change or selection of a new drill bit is made independent of the drilling tool assembly with which the drill bit will be used, and many field runs with the new bit may occur before the actual drilling performance of the new drill bit can be confirmed. Similar iterative methods are used to determine an optimum or preferred selection of components in a drilling tool assembly. Such iterative design and selection methods are time consuming and can be costly for drilling operations. In particular, replacement of a poorly performing drill bit or failure of another component of a drilling tool assembly requires the time and expense of removing the drilling tool assembly from the well bore, which may take many hours depending on the depth of the well. Also, in many cases, after using several different drill bit designs in an attempt to improve drilling performance in a series of wells, it may later be determined that drilling problems may have been better corrected by changing other parameters of the drilling tool assembly, such as operating parameters for drilling or the make up of the BHA to avoid or minimize vibration modes of the drilling tool assembly during drilling.

SUMMARY OF INVENTION

In one aspect, the present invention relates to a method for improving drilling performance of a drilling tool assembly. The method includes identifying a drilling performance parameter to be improved. At least one potential solution is defined to improve the drilling performance parameter. Next, a drilling simulation of the at least one potential solution is performed. The drilling simulation includes simulating an effect on the drilling tool assembly of an interaction of a cutting element of a drill bit with an earth formation. Improvement in the drilling performance parameter is determined based upon the drilling simulation.

In another aspect, the present invention relates to a drilling tool assembly designed using the above method.

In one aspect, the present invention relates to a computer system for improving drilling performance of a drilling tool assembly. The computer system includes a processor, a memory, a storage device, and software instructions stored in the memory. The software instruction enable the computer system under control of the processor to identify a drilling performance parameter to be improved, define at least one potential solution to improve the drilling performance parameter, and perform a drilling simulation of the at least one potential solution. The drilling simulation includes simulating an effect on the drilling tool assembly of an interaction of a cutting element of a drill bit with an earth formation. Further, the software instructions determine, based upon the drilling simulation, whether the drilling performance parameter is improved by the at least one potential solution.

In one aspect, the present invention relates to a method for improving drilling performance of a drilling tool assembly. The method includes performing a drilling simulation to simulate an original drilling operation. The drilling simulation includes simulating an effect on the drilling tool assembly of an interaction of a cutting element of a drill bit with an earth formation. A solution to improve a drilling performance parameter is defined based upon the drilling simulation.

Other aspects and advantages of the invention will be apparent from the following description and the appended claims.

BRIEF DESCRIPTION OF DRAWINGS

FIG. 5 shows an input screen for a drilling simulation in accordance with one embodiment of the present invention.

FIG. 6 shows an input screen for a drilling simulation in accordance with one embodiment of the present invention.

FIG. 13A shows an input screen for a drilling simulation in accordance with one embodiment of the present invention.

DETAILED DESCRIPTION

Figure 1:
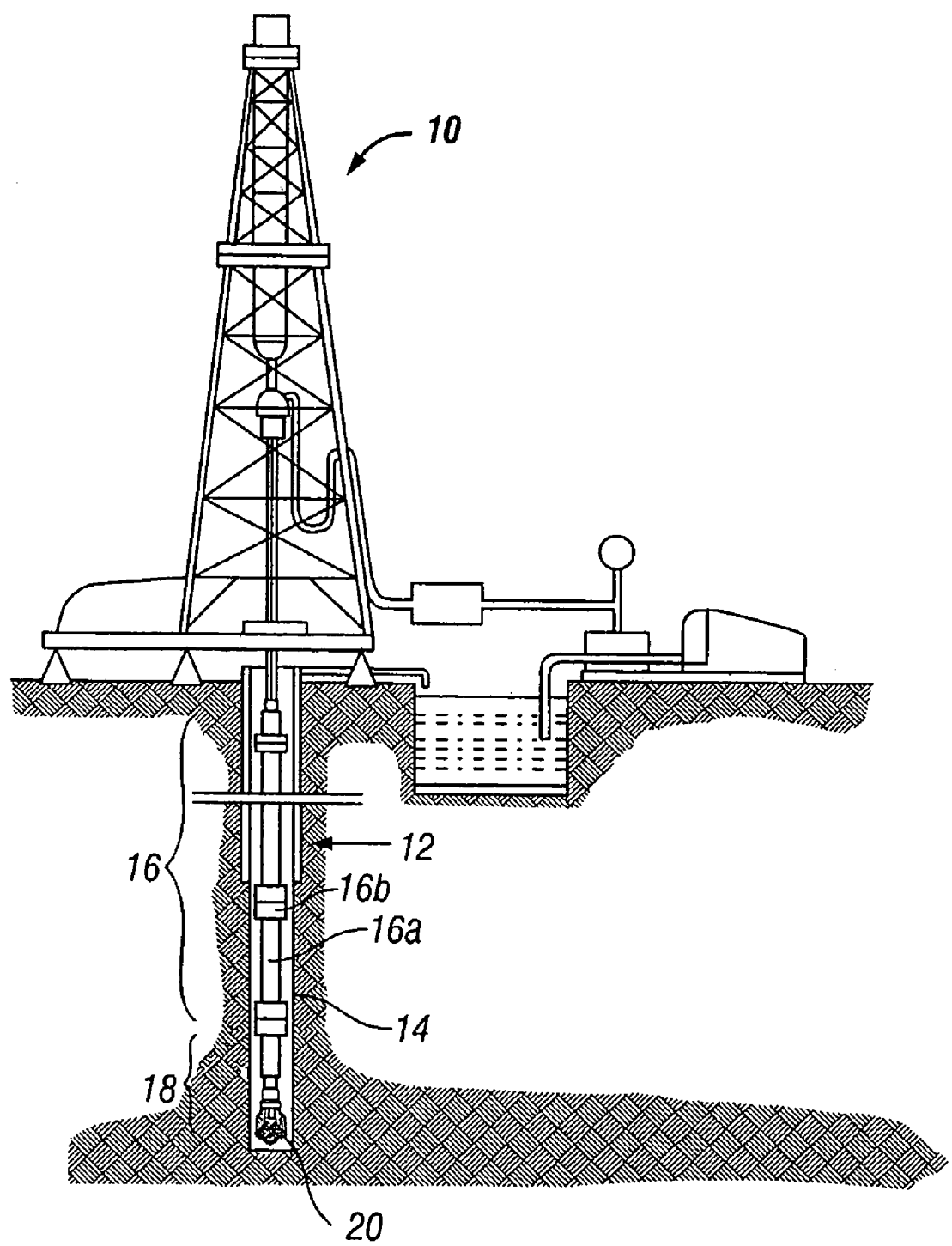
FIG. 1 shows a schematic diagram of a prior art drilling system for drilling earth formations.
Figure 2:
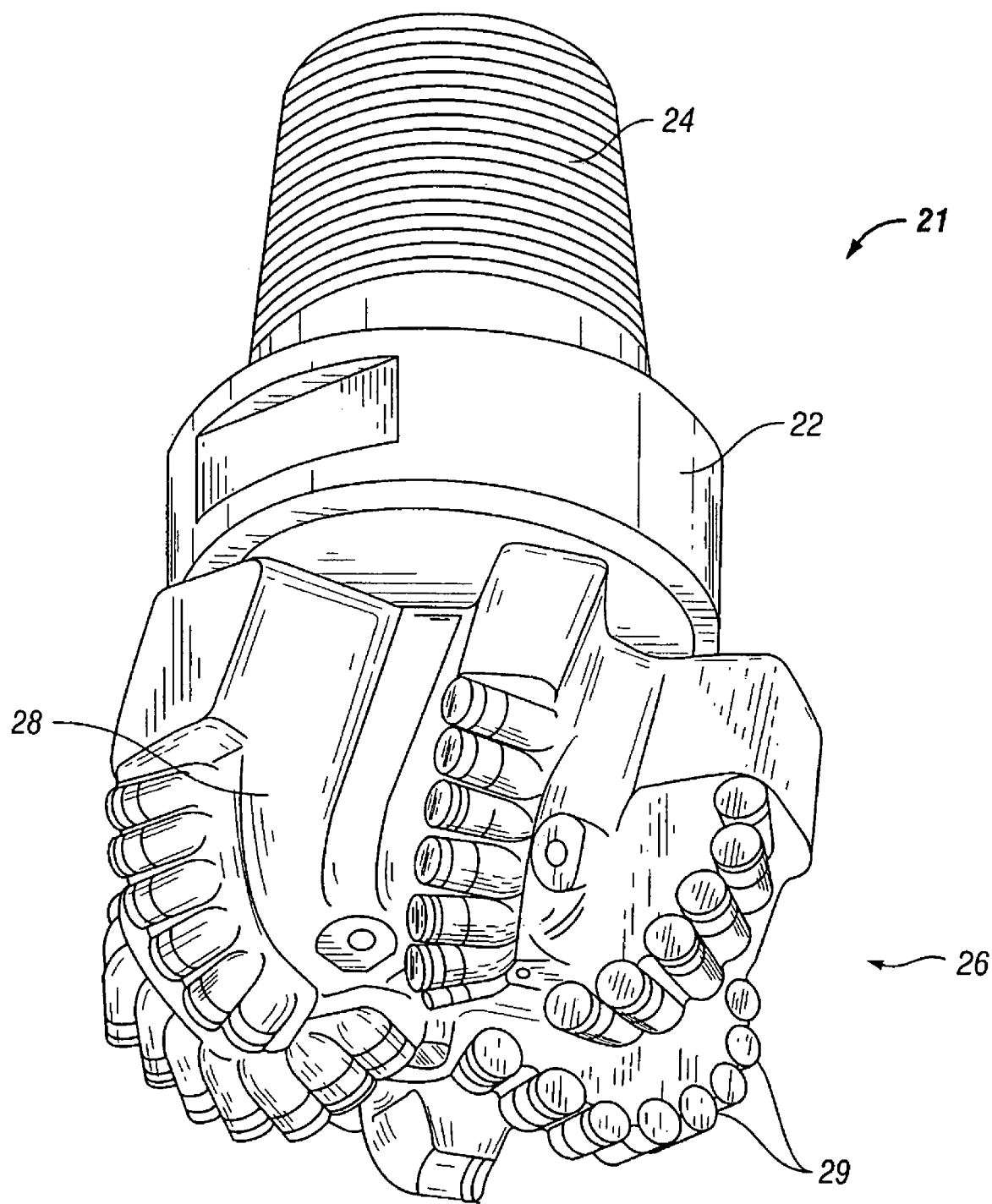
FIG. 2 shows a perspective view of a prior art fixed-cutter bit.
Figure 3:
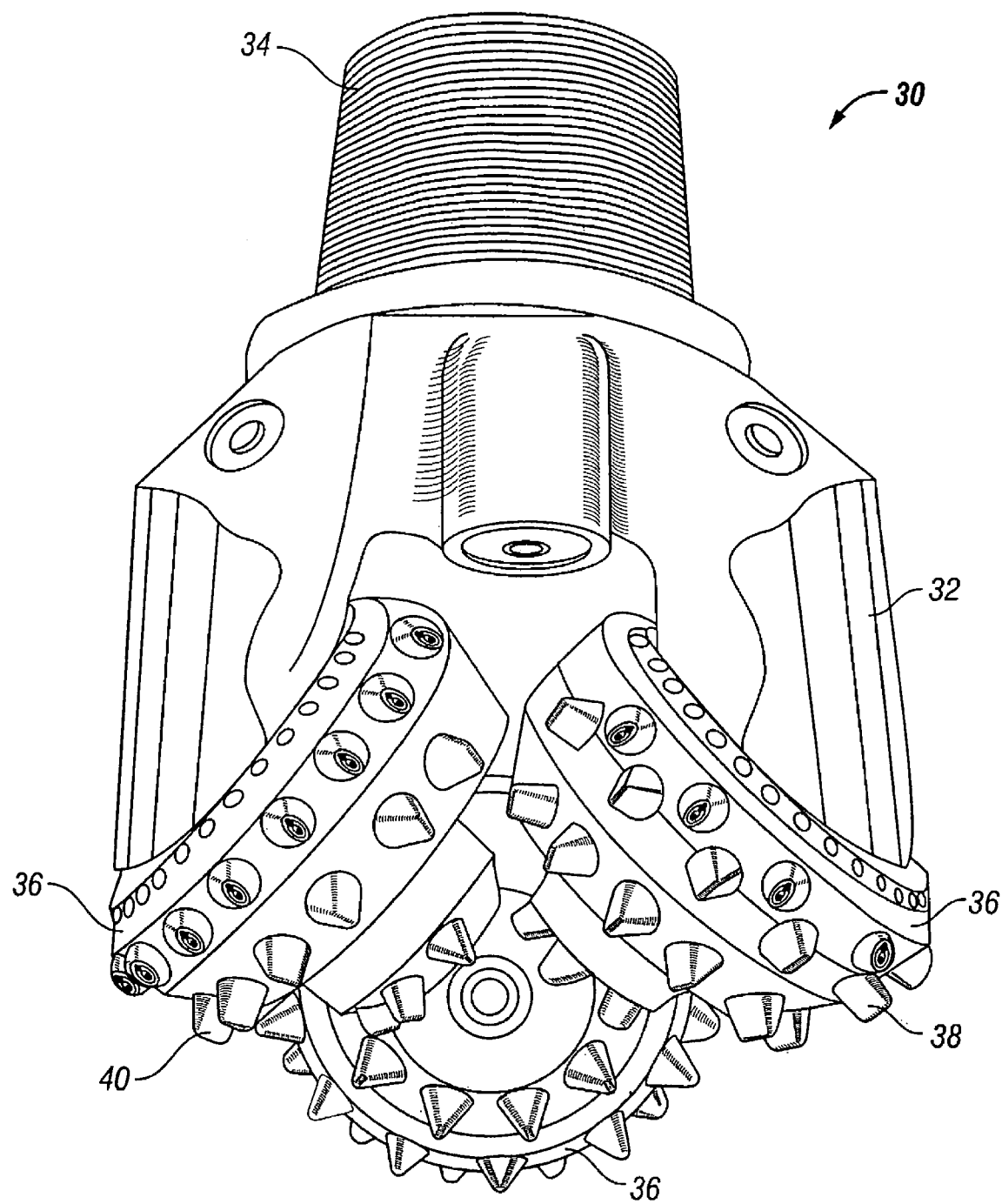
FIG. 3 shows a perspective view of a prior art roller cone bit.

In one aspect, the present invention provides a method for evaluating drilling information to provide a solution to improve drilling performance. In one embodiment, the method includes obtaining drilling information and evaluating the drilling information to determine the performance of an actual drilling tool assembly in drilling earth formation or to establish the expected performance of a proposed drilling tool assembly in drilling earth formation. The method may further include utilizing the evaluation and/or the determined performance of the drilling tool assembly to define at least one potential solution to improve the drilling performance of the actual or proposed drilling tool assembly. A solution may involve any combination of adjustments to the drilling tool assembly design parameters or the operating parameters used for drilling with the drilling tool assembly.

In another aspect, the present invention provides a method for improving the drilling performance of a drilling tool assembly. In one embodiment, the method includes obtaining and evaluating drilling information to identify potential solutions to improve drilling performance. The method further includes performing dynamic simulation for the potential solutions and comparing simulation results for the at least one potential solutions to at least one selected drilling performance criterion. Then, based on the comparison, selecting at least one solution for use in drilling a well bore.

In selected embodiments, the method may further include using the selected solution in the drilling of a well bore and obtaining post-run drilling information from the well drilled using the solution. The post-run drilling information may be compared to drilling simulation results and/or the at least one selected drilling performance criterion to determine if further improvement in drilling performance is desired. If further improvement is desired, the post-run drilling information may be evaluated and used to identify new potential solutions to further improve drilling performance. The post-run drilling information may also be used to recalibrate the simulation system to more closely match the actual drilling operation.

Drilling performance may be measured by one or more drilling performance parameters. Examples of drilling performance parameters include rate of penetration (ROP), rotary torque required to turn the drilling tool assembly, rotary speed at which the drilling tool assembly is turned, drilling tool assembly lateral, axial, or torsional vibrations induced during drilling, weight on bit (WOB), forces acting on components of the drilling tool assembly, and forces acting on the drill bit and components of the drill bit (e.g., on blades, cones, and/or cutting elements). Drilling performance parameters may also include the inclination angle and azimuth direction of the borehole being drilled. One skilled in the art will appreciate that other drilling performance parameters exist and may be considered without departing from the scope of the invention.

In accordance with one or more embodiments of the invention, a drilling tool assembly includes at least one segment (or joint) of drill pipe and a drill bit. The components of a drilling tool assembly may be more generally referred to as a drill string and a bottomhole assembly (BHA). The drill string as discussed herein refers to a string of drill pipe, which includes one or more joints of drill pipe. The BHA includes at least a drill bit.

In a typical drilling tool assembly, the drill string includes several joints of drill pipe connected end to end, and the bottomhole assembly includes one or more drill collars and a drill bit attached to an end of the BHA. The BHA may further include additional components, such as stabilizers, a downhole motor, MWD tools, and LWD tools, subs, hole enlargement devices, jars, accelerators, thrusters, and/or a rotary steerable system, for example. Therefore, in accordance with embodiments of the invention, a drilling tool assembly may be a single segment of drill pipe attached to a drill bit, or as complex as a multi-component drill string that includes a kelly, a lower kelly cock, a kelly saver sub, several joints of drill pipe with tool joints, etc., and a multi-component BHA that includes drill collars, stabilizers, and other additional specialty items (e.g., reamers, valves, MWD tools, mud motors, rotary steerable systems, etc.) and a drill bit.

While the BHA is generally considered to include a drill bit, in the example drilling simulation method discussed below, the detailed interaction of the drill bit with the bottomhole surface during drilling is generally considered separately. This separate consideration of the drill bit in detail allows for the interchangeable use of any drill bit model in the drilling tool assembly simulation as determined by the system designer. Drill bits used and modeled in one or more embodiments of the invention may include, for example, fixed cutter bits, roller cone bits, hybrid bits (bits having a combination of fixed cutters and rolling cutting structure), bi-centered bits, reaming bits, or any other cutting tool used during the drilling of earth formation. One of ordinary skill in the art will appreciate that the drilling simulation method may consider the drill bit jointly with the drilling tool assembly without departing from the scope of the invention.

One example of a method that may be used to simulate a drilling tool assembly in accordance with one or more embodiments of the invention is disclosed in U.S. patent application Ser. No. 09/689,299 entitled "Simulating the Dynamic Response of a Drilling Tool Assembly and its Application to Drilling Tool Assembly Design Optimizing and Drilling Performance Optimization", which has been incorporated by reference in its entirety. In accordance with this method, properties of the drilling to be simulated are provided as input. The input may include drilling tool assembly design parameters, well bore parameters, and drilling operating parameters.

Examples of drilling tool assembly design parameters include the type, location, and number of components included in the drilling tool assembly; the length, ID, OD, weight, and material properties of each component; the type, size, weight, configuration, and material properties of the drill bit; and the type, size, number, location, orientation, and material properties of the cutting elements on the drill bit. Material properties in designing a drilling tool assembly may include, for example, the strength, elasticity, and density of the material. It should be understood that drilling tool assembly design parameters may include any other configuration or material parameter of the drilling tool assembly without departing from the scope of the invention.

The geometry and material properties ("bit design parameters") of the drill bit are typically defined in greater detail than other components in the drilling tool assembly. Examples of simulation methods for drill bits are provided in U.S. Pat. No. 6,516,293, entitled "Method for Simulating Drilling of Roller Cone Bits and its Application to Roller Cone Bit Design and Performance," and U.S. Provisional Application No. 60/485,642, filed Jul. 9, 2003 and entitled "Methods for Modeling, Designing, and Optimizing Fixed Cutter Bits," which are both assigned to the assignee of the present invention and now incorporated herein by reference in their entirety. In accordance with this method, the bit design parameters include the cutting structures on the drill bit, such as cutting element geometry, quantity, and locations. As with other component in the drilling tool assembly, the material properties of the drill bit are defined. In one embodiment, the drill bit is defined with the drilling tool assembly. In another embodiment, the drill bit may be defined separately and stored in a library of drill bit designs. The separate drill bit could then be selected and integrated with the drilling tool assembly. In another embodiment, other components in the drilling tool assembly may also be defined separately and stored in a library. The library approach reduces the need to redefine components unnecessarily.

Well bore parameters typically include the geometry of a well bore and formation material properties. The trajectory of a well bore in which the drilling tool assembly is to be confined also is defined along with an initial well bore bottom surface geometry. Because the well bore trajectory may be straight, curved, or a combination of straight and curved sections, well bore trajectories, in general, may be defined by defining parameters for each segment of the trajectory. For example, a well bore may be defined as comprising N segments characterized by the length, diameter, inclination angle, and azimuth direction of each segment and an indication of the order of the segments (i.e., first, second, etc.). Well bore parameters defined in this manner can then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore and well bore fluid properties, without departing from the scope of the invention.

Drilling operating parameters typically include the rotary table (or top drive mechanism), speed at which the drilling tool assembly is rotated (RPM), the downhole motor speed (if a downhole motor is included) and the hook load. Drilling operating parameters may further include drilling fluid parameters, such as the viscosity and density of the drilling fluid, for example. It should be understood that drilling operating parameters are not limited to these variables. In other embodiments, drilling operating parameters may include other variables, e.g. rotary torque and drilling fluid flow rate. Additionally, drilling operating parameters for the purpose of drilling simulation may further include the total number of drill bit revolutions to be simulated or the total drilling time desired for drilling simulation. Once the parameters of the system (drilling tool assembly under drilling conditions) are defined, they can be used along with various interaction models to simulate the dynamic response of the drilling tool assembly drilling earth formation as described below.

Figure 4:
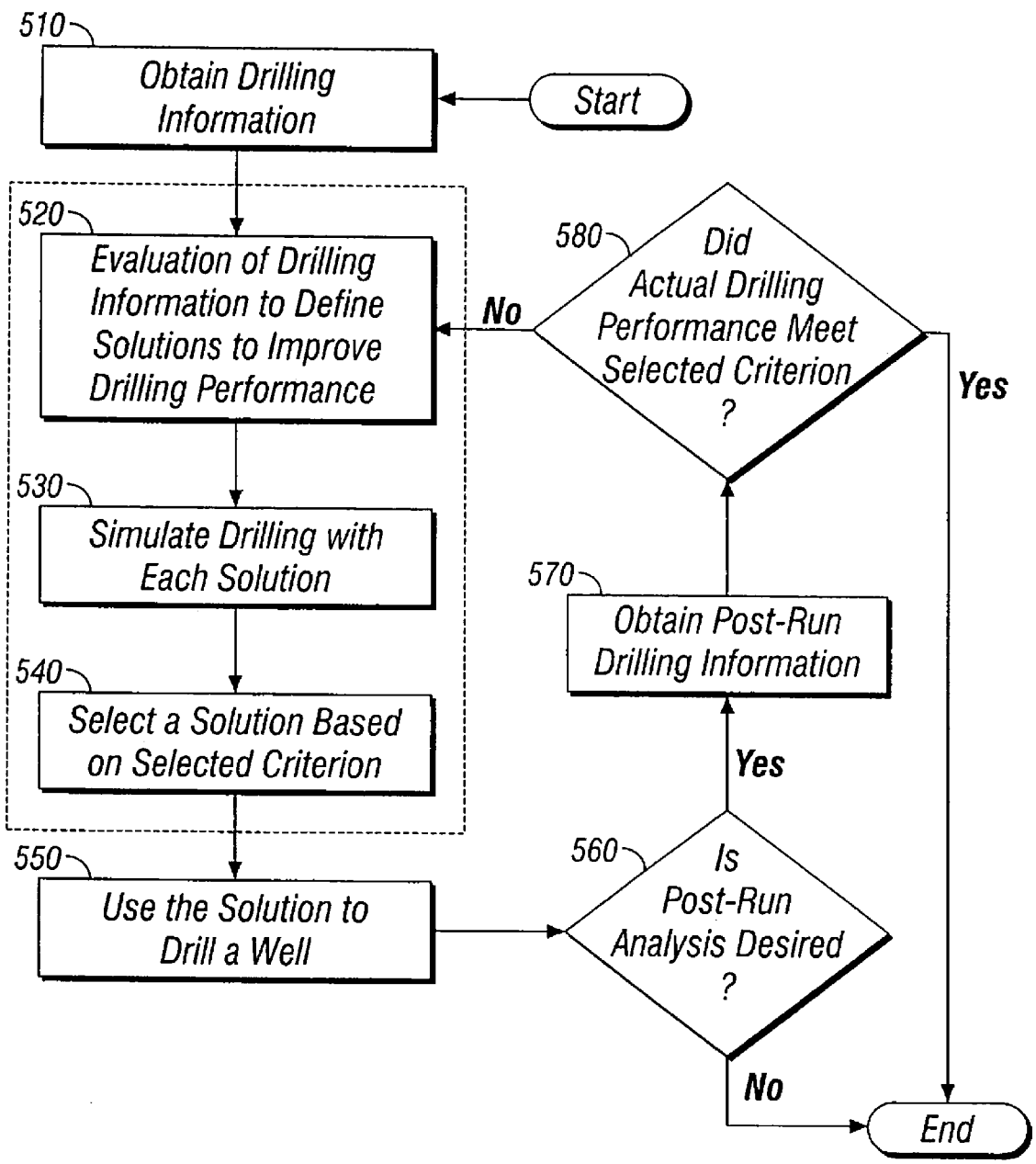
FIG. 4 shows a flow chart of a method in accordance with one embodiment of the present invention.

FIG. 4 shows one embodiment of a method that involves the evaluating of drilling information to provide a solution to improve a drilling performance. The method includes obtaining drilling information (step 510). Drilling information may include information characterizing the geometry of a well bore, geological information, a drilling tool assembly design, and drilling operating parameters. The drilling information may be obtained from offset wells, which are existing wells close to the proposed location of a planned well. An offset well typically provides formation properties that are very similar to what will be encountered when drilling another nearby well. In some instances, the offset wells may be those previously drilled by a driller, and that driller may want to improve drilling operations conducted for similar future wells. Alternatively, the drilling information may be provided from a proposed well plan created by a customer, such as a drilling operator, directional company, or drilling contractor, with the desired geometry for the well defined by the customer and the geological information, such as formation type and rock strength, obtained from offset well data. For example, formation type may be obtained from mud logs, and rock strength may be calculated from sonic, density and/or porosity logs for wells in the area. The drilling tool assembly design and drilling operating parameters may be provided by the customer. In some cases, a drilling tool assembly design and drilling operating parameters may be created by a designer based on other drilling information. One of ordinary skill in the art will appreciate that more or less drilling information may be provided from different sources or selected without departing from the scope of the present invention.

The drilling information obtained from step 510 is then evaluated to identify at least one potential solution that may be applied to a drilling operation to improve drilling performance (step 520). The evaluation of drilling information may be performed in various ways. In some embodiments, the experience of a drilling engineer (or a drilling tool assembly design engineer) may be used to evaluate the drilling information and define potential solutions to improve drilling performance. In other embodiments, a neural network on a computer may generate solutions based on an evaluation of the drilling information and past experience. In one or more embodiments, a drilling engineer may perform a drilling simulation based on the drilling information to confirm that a simulation will give a good representation of actual drilling and/or to identify potential causes of reduced drilling performance. One of ordinary skill in the art will appreciate that the evaluation of drilling information to identify or define potential solutions to improve drilling performance may be performed in a number of different ways without departing from the scope of the present invention.

Next, drilling with each of the potential solutions is simulated (step 530). Specifically, the drilling simulations include drilling through an earth formation with a selected drilling tool assembly wherein the effects on the drilling tool assembly caused by the interaction of one or more cutting elements on the drill bit with the earth formation is determined. The simulation takes into account the dynamic response of the drilling tool assembly in drilling through the earth formation under the defined drilling operation parameters. The interaction between the selected drill bit and the earth formation is calculated and its effect on the drilling tool assembly determined.

The drilling simulations for the potential solutions are compared to a selected drilling performance criterion, and based on the comparison, at least one of the potential solutions is selected (step 540) as a solution to improve drilling performance. This may be done by comparing the recorded results for each potential solution to each other in view of a selected drilling performance criterion, such as a desire for a maximum ROP, wherein the potential solution resulting in a simulated response that best satisfies the selected drilling performance criterion is selected and proposed as the solution for improving drilling performance. Typically, at least one drilling performance criterion is selected from drilling performance parameters and used as a metric for the solutions defined from the analysis of drilling information. The drilling performance criterion may relate to a selected ROP, drill bit life, vibrations experienced by one or more components, predicted cost of the well, WOB, forces on one or more components, or any other value or parameter considered important in a particular drilling operation that is desired to be improved. In some embodiments, more than one drilling performance criterion may be used. One of ordinary skill in the art will appreciate that any relevant metric may be used to evaluate drilling performance without departing from the scope of the invention. After selecting a solution (step 540), the selected solution can then be applied to a drilling operation and used in the drilling of a well (step 550)

Continuing with the method in FIG. 4, in one or more embodiments, further improvement or adjustment to the drilling performance may be desired after using the solution in the drilling of a well (step 560). For example, to determine the effectiveness of a selected solution applied to a drilling operation, post-run drilling information may be obtained from the drilling performed with the provided solution (step 570). The post-run information may be compared with a new or the original selected drilling performance criterion (step 580). If further improvement to the drilling performance is desired, the post-run drilling information may be evaluated to define additional solutions that may improve drilling performance (step 520). This iterative process of obtaining post-run drilling information and evaluating it to define additional solutions may be repeated to further improve drilling performance with each use of a solution to drill a well. In one embodiment, the post-run drilling information may be compared to the drilling simulation to calibrate the model.

In one embodiment, drilling information may be obtained from an offset well previously drilled by a customer. The drilling information may include the desired well geometry and geological characteristics. Additionally, a previously used drilling assembly and drilling operating parameters may also be provided by the customer. This drilling information may then be evaluated to define potential solutions. In one embodiment, an engineer may model the drilling tool assembly used to obtain the drilling information and simulate drilling with it in the defined drilling environment under the defined operation parameters to provide a baseline for comparing potential solutions. This may also be done to confirm the accuracy of the simulation model in predicting actual drilling responses and/or to identify the potential causes of problems that occurred during drilling. When preparing this baseline, potential solutions that may be applied to improve the drilling performance may be observed without requiring further drilling simulations. In another embodiment, an engineer or neural network may evaluate the drilling information and define potential solutions based on experience without requiring a baseline and, then, simulations may be run for the potential solutions.

In some embodiments, the drilling simulation provides several visual outputs of the drilling performance parameters. The outputs may include tabular data of one or more drilling performance parameters. Additionally, the outputs may be in the form of graphs of a drilling performance parameter, possibly with respect to time. A graphical visualization of drill string may also be output. The graphical visualization (e.g., 2-D, 3-D, or 4-D) may include a color scheme for the drill string and BHA to indicate drilling performance parameters at locations along the length of the drill string and bottom hole assembly.

The overall drilling performance of the drill string and bottom hole assembly may be determined by examining one or more of the available outputs. One or more of the outputs may be compared to the selected drilling performance criterion to determine suitability of a potential solution. For example, a 3-D graphical visualization of the drill string may have a color scheme indicating vibration quantified by the sudden changes in bending moments through the drilling tool assembly. Time based plots of accelerations, component forces, and displacements may also be used to study the occurrence of vibrations. Other drilling performance parameters may also be illustrated simultaneously or separately in the 3-D graphical visualization. Additionally, the 3-D graphical visualization may display the simulated drilling performed by the drilling tool assembly.

For the purposes of illustration, a specific example in accordance with one embodiment of the present invention will now be described. In this hypothetical situation, a drilling operator has a plan to drill 10 wells in one area of South Texas. During the drilling of the first well, the drilling operator experienced low ROP and short drill bit life while drilling from 5,000 feet to 8,000 feet. The drilling operator wants to improve drilling performance for the remaining wells. In accordance with one embodiment of the invention, an engineer obtains the drilling information from the previous well. The drilling information includes the drilling tool assembly parameters, drilling operating parameters, and well parameters. Because the future wells will be drilled close to the first well, the formation characteristics will be similar. Understanding the poor past drilling performance will allow for improvements in drilling performance in the future wells.

First, the drilling operator provides a drilling engineer with drilling information, which includes the above information. In addition to the previously discussed information, pictures of the used drill bits are provided. The wear patterns and dullness on the used drill bit suggest that downhole vibrations are occurring locally at the drill bit. These vibrations were not detected by the surface sensors during drilling. This may be because vibrations were dampened before they reach the surface or sensors positioned on the drilling tool assembly. This suggests that the vibrations may have been caused by the BHA configuration or the particular drill bit that was used. To evaluate the drill bit as a potential cause, several drill bits are proposed as a solution to the drilling performance problems. The potential solutions are to be compared based on ROP and lowest vibrations. A reduction in vibrations is expected to increase the life of the drill bit. The next step is to simulate drilling with the candidate drill bits.

Figure 5:
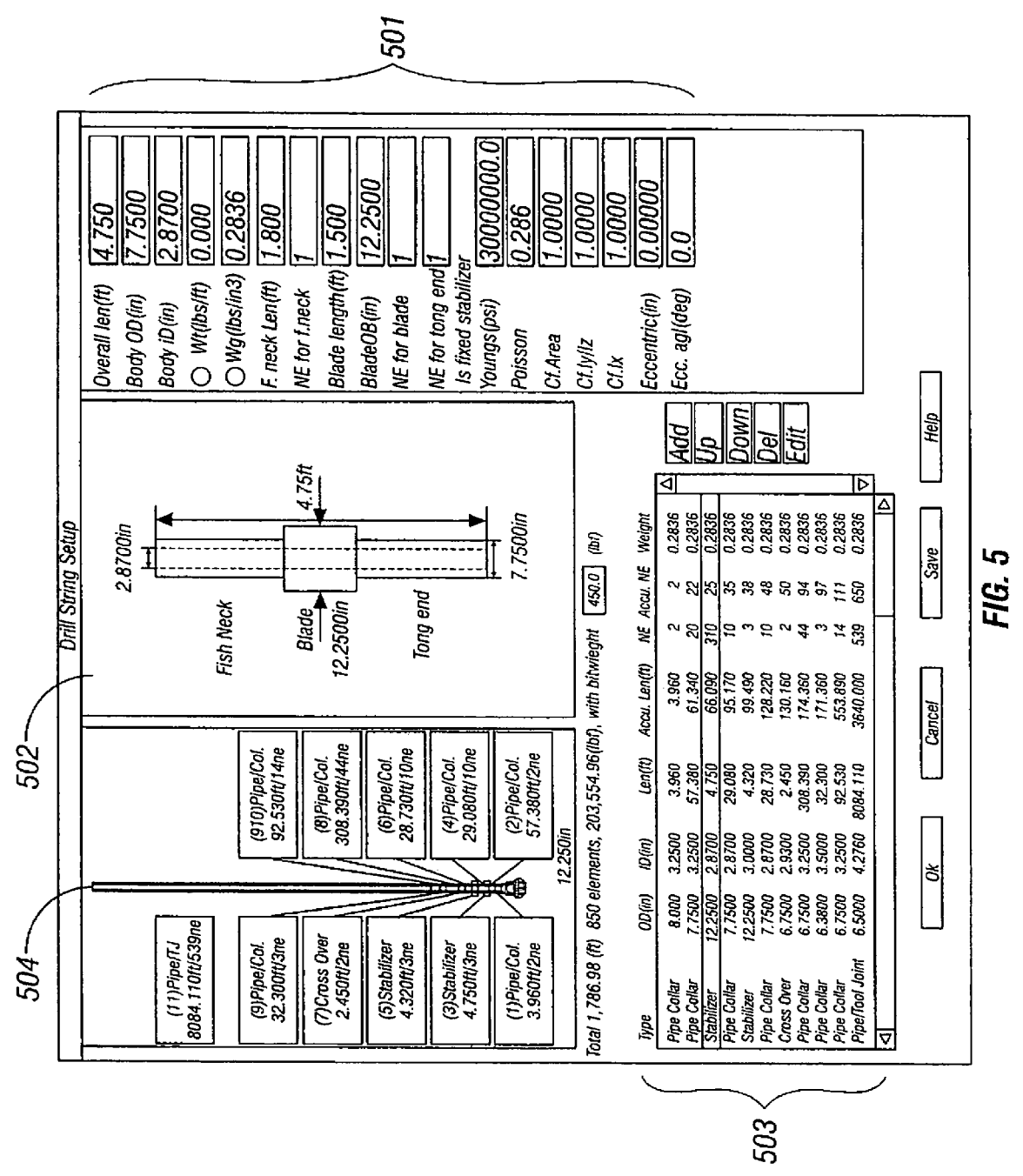

Next, the drilling tool assembly that was used for the first well is modeled. FIG. 5 shows an example input screen used to define components of the drilling tool assembly in accordance with one embodiment of the invention. In FIG. 5, a stabilizer is described by entering dimensions and material properties into the input boxes 501. The component display 502 shows the component that has been described. Other components are also defined. The components are combined to form the drilling tool assembly. In this program, the components in the drilling tool assembly are shown as a component list 503 and as a drilling tool assembly layout 504. The drilling tool assembly will be kept the same between the simulations, except for changing the drill bits.

Before the drilling simulation, the well bore environment is also defined. Well logs from the offset well previously drilled by the drilling operator are used to model the well bore for simulation purposes. Well bore parameters are entered into an input screen shown in FIG. 6 in accordance with one embodiment of the invention. The geometry of the well bore is entered into 510 in increments of depth. The particular well being simulated is 7,000 feet in total measured depth. Until 4,000 feet, the well is near vertical. At this point, a build angle of 5 degrees per hundred feet begins until reaching 65 degrees inclination at 5,300 feet total measured depth. The well is nearly straight beyond 5,300 feet. The drilling simulation will occur at 7,000 feet while drilling mudstone having an unconfined compressive strength of 11,000 pounds per square inch.

Other well bore parameters are also entered into the input screen shown in FIG. 6. In this embodiment, the diameter, drilling fluid (mud) density, well stiffness, coefficient of restitution, and coefficients of friction are entered under well bore data 511. Well stiffness 522 is measured in pressure and refers to the mechanical strength of the wall of the well bore. The coefficient of restitution 517 refers to how much energy is dissipated or absorbed by the wall of the well bore when the drilling tool assembly touches or impacts it. The coefficients of friction shown in FIG. 6 are transverse dynamic 518, transverse static 519, axial dynamic 520, and axial static 521. The axial coefficients of friction refer to the friction experienced against the wall of the well bore as the drilling tool assembly moves with the axis of the well bore. The transverse coefficients of friction refer to the friction experienced against the wall of the well bore as the drilling tool assembly moves perpendicular to the axis or rotates. The defined well bore is shown in a tabular form 512, and may be viewed in a three-dimensional view 513.

After setting up the parameters for the drilling simulation, drilling with each drill bit is simulated using the same drilling tool assembly and in the same well bore. In this embodiment, the drilling operating parameters are selected as appropriate for the designs of the candidate drill bits. The drilling simulation includes the interaction of the cutting elements on the drill bit with the earth formation.

Figure 7A:
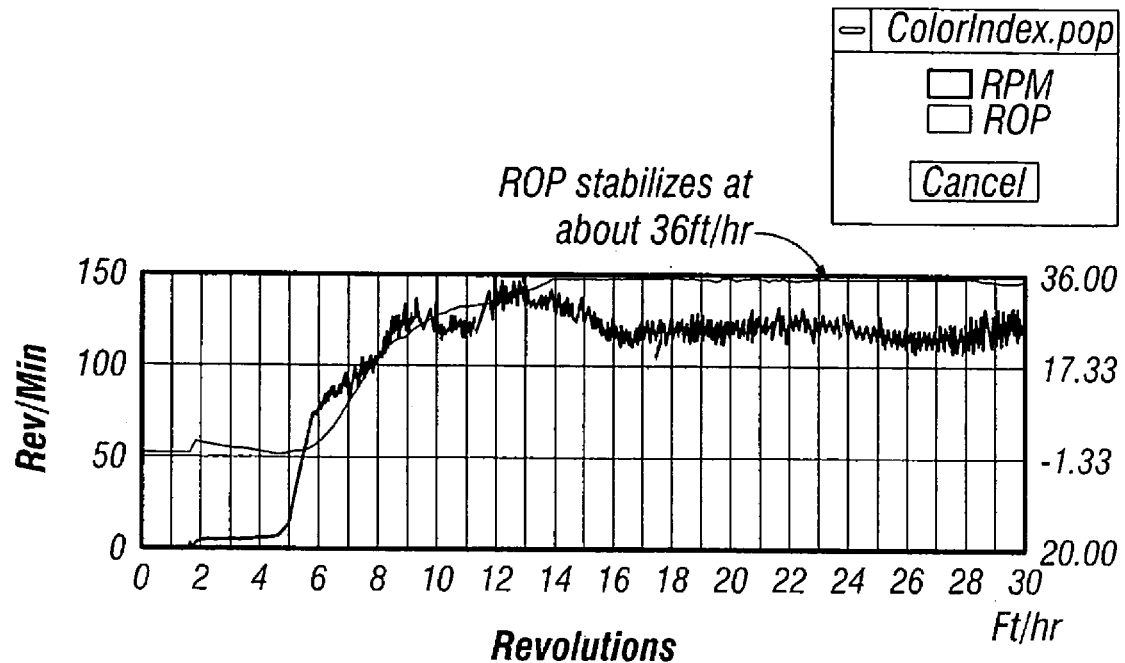
FIG. 7A shows a graphical visualization of a drilling performance parameter from a drilling simulation in accordance with one embodiment of the present invention.
Figure 7B:
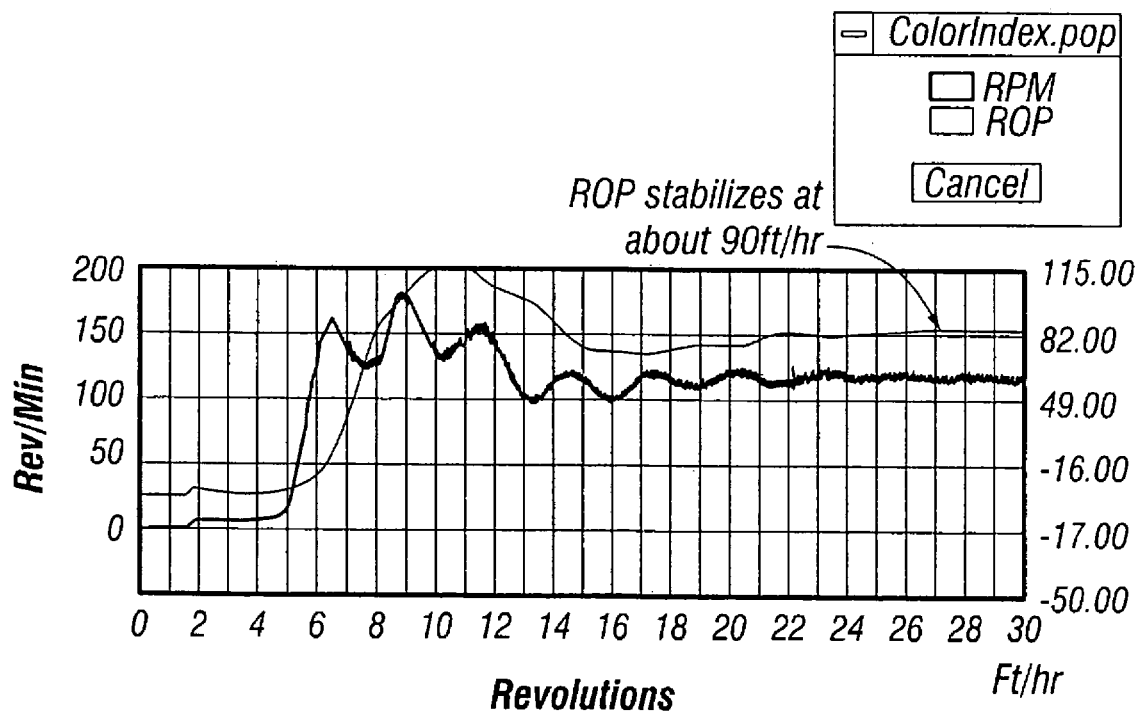
FIG. 7B shows a graphical visualization of a drilling performance parameter from a drilling simulation in accordance with one embodiment of the present invention.

In this example, highest ROP and lowest vibrations are the selected drilling performance criteria. Upon completion of the drilling simulations, the outputs of the simulations are compared to the selected drilling performance criteria. Various outputs are provided from the drilling simulation to evaluate the drilling performance. Although additional drilling simulations may be run, only two of the potential solutions are shown for clarity. The two solutions examined in greater detail are candidate drill bits A and B. FIGS. 7A and 7B are outputs of the drilling simulations in accordance with an embodiment of the invention. Candidate drill bit B shown in FIG. 7B achieves a ROP of 90 feet/hour, which is much greater than the 36 feet/hour achieved by candidate drill bit A shown in FIG. 7A.

Figure 8:
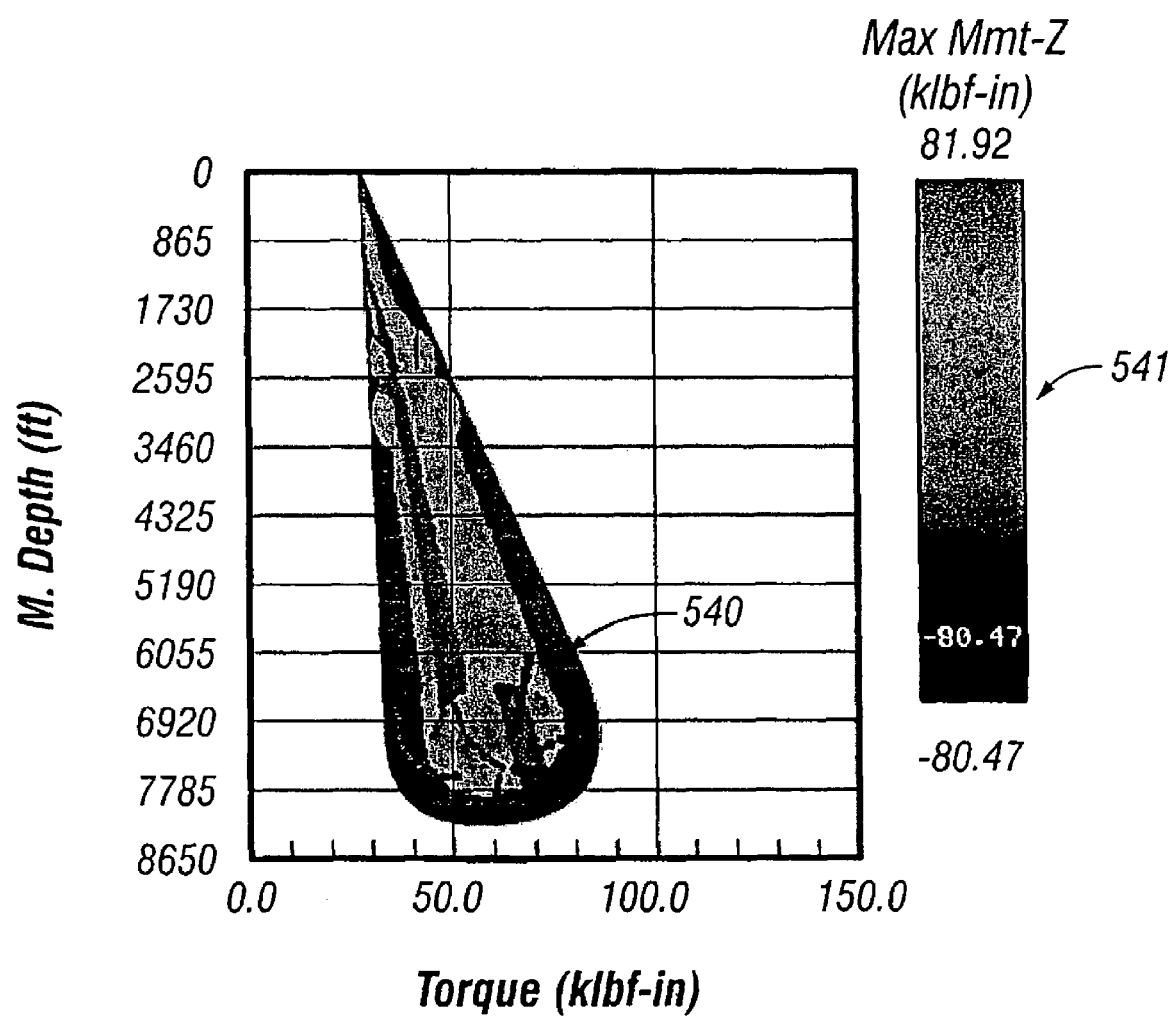
FIG. 8 shows a graphical visualization of a drilling tool assembly in accordance with one embodiment of the present invention.
Figure 9A:
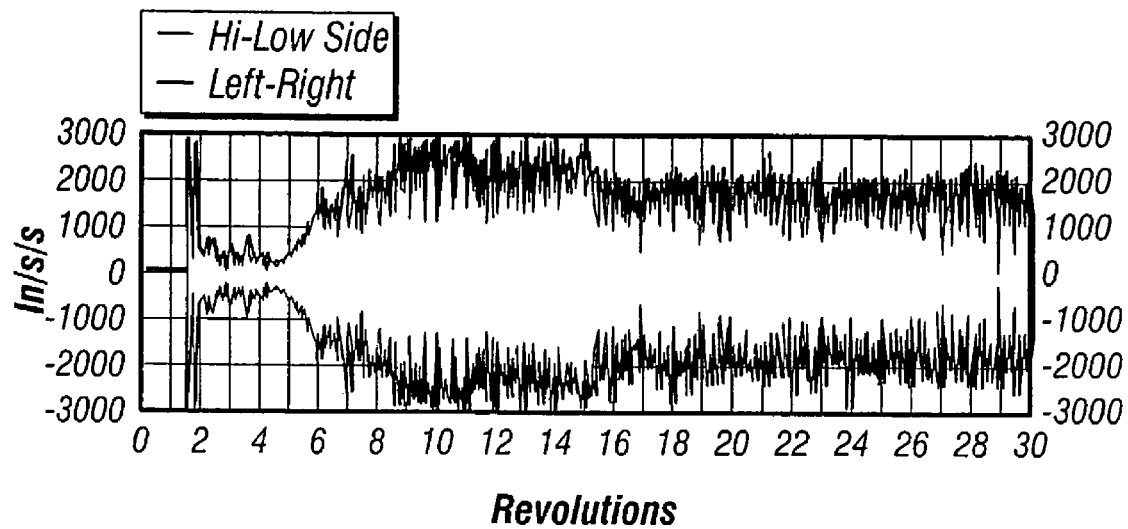
FIG. 9A shows a graphical visualization of a drilling performance parameter from a drilling simulation in accordance with one embodiment of the present invention.
Figure 9B:
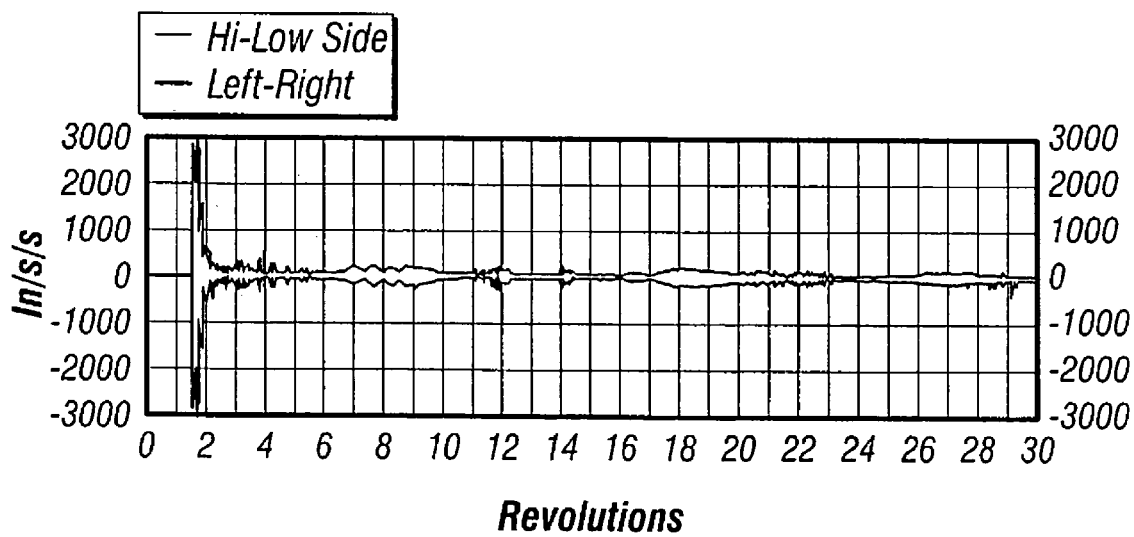
FIG. 9B shows a graphical visualization of a drilling performance parameter from a drilling simulation in accordance with one embodiment of the present invention.
Figure 10A:
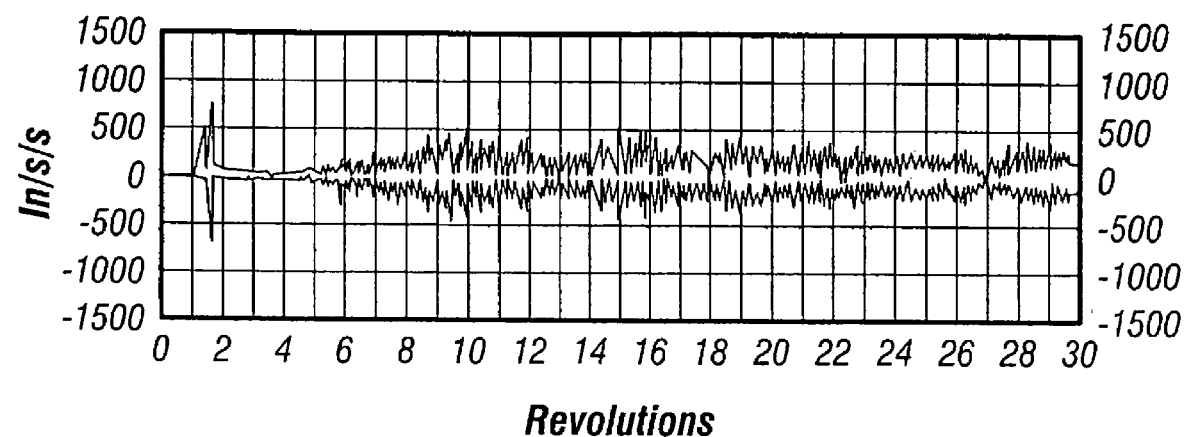
FIG. 10A shows a graphical visualization of a drilling performance parameter from a drilling simulation in accordance with one embodiment of the present invention.
Figure 10B:
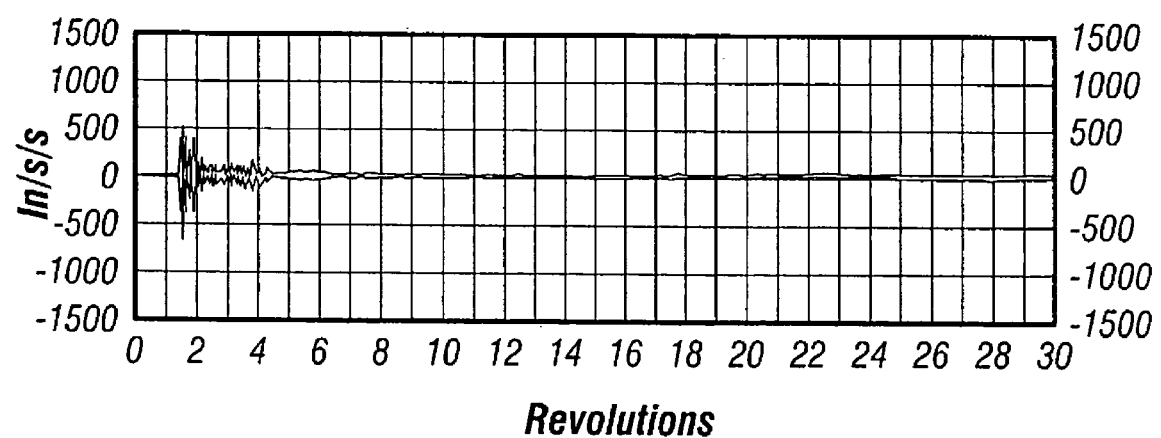
FIG. 10B shows a graphical visualization of a drilling performance parameter from a drilling simulation in accordance with one embodiment of the present invention.

The other selected criterion is vibration of the drill bit, which influences the life span of the drill bit. FIG. 8 shows a three-dimensional graphical representation of candidate drill bit A in accordance with one embodiment of the invention. Instability of the drill bit is indicated at 540 by a large bending moment. The experienced bending moment is quantified by a scale 541. The instability is confirmed by FIG. 9A, which displays the lateral vibration of candidate drill bit A. The lateral vibration is measured in inch/second$^2$. The span of large positive and negative acceleration indicates that the lateral vibration is problematic for candidate drill bit A. FIG. 9B displays the lateral vibration of candidate drill bit B, which is significantly lower than candidate drill bit B. FIGS. 10A and 10B display the axial vibrations experienced by candidate drill bits A and B, respectively. Candidate drill bit B experiences less axial vibrations than candidate drill bit A.

In the example above, candidate drill bit B satisfied the drilling performance criteria of high ROP and low vibrations. The use of candidate drill bit B is the selected solution for use in drilling the next well by the drilling operator. The preceding example is only for the purpose of illustrating the usage of a method in accordance with one embodiment of the present invention. One of ordinary skill in the art will appreciate that more or less drilling information can be obtained from different sources without departing from the scope of the invention. Additionally, other drilling performance criterion may be selected for improvement. The displays shown in the preceding example are not intended to limit the scope of the invention.

Another example of a method for evaluating drilling information to provide a solution to improve drilling performance follows. Specifically, in this hypothetical, a customer has damaged an MWD tool while drilling a well offshore. The cause of the damage is unknown. The damage to the MWD tool has resulted in additional time and expense to trip the drilling tool assembly out of the well and replace the MWD tool. Additionally, repairing the MWD tool is costly. The customer wishes to discover the cause for the MWD damage and to have a solution to prevent the damage to another MWD tool. To discover the cause, drilling information is obtained from the customer. To evaluate the drilling information, the drilling tool assembly is modeled and simulated as described with the drilling information. This drilling simulation provides a baseline to understand the cause of the MWD damage and to define a solution to the problem.

Figure 11:
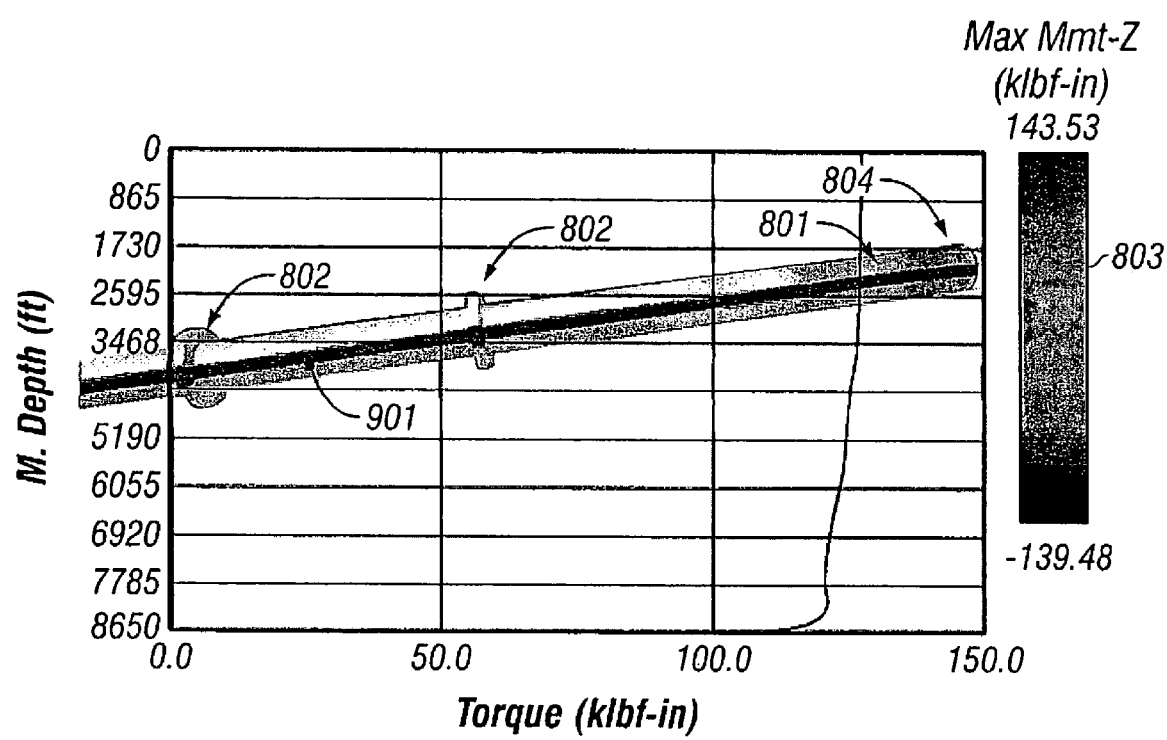
FIG. 11 shows a graphical visualization of a drilling tool assembly in accordance with one embodiment of the present invention.

Continuing with the MWD tool example, graphical outputs of drilling performance characteristics from the drilling simulation are used to reveal the cause of the MWD damage. FIG. 11 is an example of a 3-D graphical representation of bending moments in a simulated drill string and bottom hole assembly. In this example, the drill bit is a PDC drill bit 804 having 8 blades. The MWD tool location 801 is a few feet above the PDC drill bit 804. As shown, the scale 803 quantifies the bending moments throughout the model. Severe bending occurs at the MWD tool location 801. However, the 3-D representation clearly shows that a minimal amount of bending occurs between the two stabilizers 802, indicating a suitable location for the MWD tool.

Figure 12A:
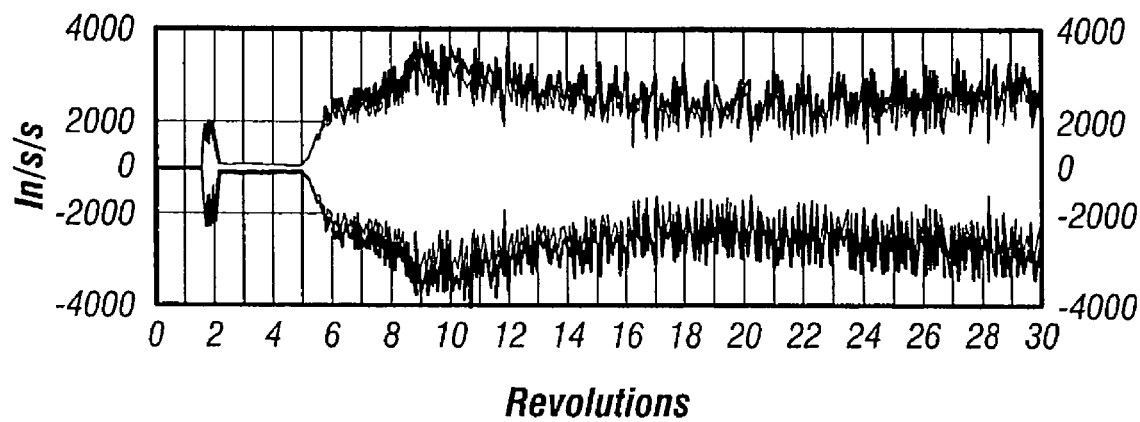
FIG. 12A shows a graphical visualization of a drilling performance parameter from a drilling simulation in accordance with one embodiment of the present invention.
Figure 12B:
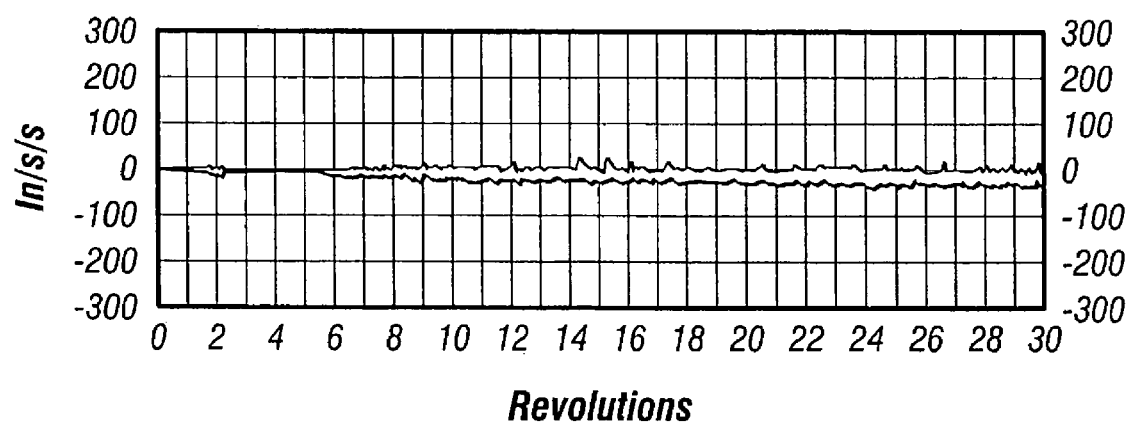
FIG. 12B shows a graphical visualization of a drilling performance parameter from a drilling simulation in accordance with one embodiment of the present invention.

Vibration is examined at the MWD tool location 801 and at the suggested location 901. FIGS. 12A and 12B display the vibrations experienced at those locations, respectively. The comparison of the two locations clearly indicates that relocating the MWD tool can prevent damage. A proposed solution is to move the MWD tool to the suggested location 901 between the two stabilizers 802. This solution does not require a complete drilling simulation (including evaluating multiple solutions) because the initial drilling simulation during the evaluation clearly defines the solution as moving the MWD tool between the stabilizers.

In some instances, the MWD tool must be located near the drill bit for data gathering purposes. If moving the MWD tool to the suggested location 901 is not acceptable, then other solutions to reduce vibration of the MWD tool and optimize overall drilling performance may be proposed based on the drilling simulations of multiple alternative solutions. For example, a different drill bit may be proposed, or a stabilizer could be located closer to the drill bit. Many potential solutions may be available to reach a desired drilling performance level. The chosen solution will vary depending on the exact scenario. After defining potential solutions, the potential solutions may be simulated and selected as discussed in previous embodiments.

In some embodiments, a method for evaluating drilling information to improve drilling performance is used to predict the direction of drilling and adjustments are made to the proposed drilling tool assembly to obtain a desired well trajectory. Drilling simulation of a drilling tool assembly may assist in predicting the direction of drilling. In some instances, the driller may require that directional motors be used to "build" an angle in the well. A build angle is the rate that the direction of the longitudinal axis of the well bore changes, which is commonly measured in degrees per 100 feet. The extent of the build angle may also be referred to as the "dogleg severity." Another important directional aspect is the "walk" rate. The walk rate refers to the change in azimuthal (compass) direction of the well bore. Control and prediction of the drilling direction is important for reaching target zones containing hydrocarbons.

In other cases, a driller might desire that the direction of the well bore be maintained for a certain distance. One scenario is when a driller experiences difficulty in maintaining a vertical well bore while drilling through a particular rock formation. In this scenario, a portion of the well has already been drilled, and the well geometry can be modeled to match the previously drilled well bore. To simulate the specific rock, geological properties may be provided with the drilling information. The compressive rock strength and formation anisotropy index (i.e., the variation of physical properties by direction in the formation) may be calculated from data from nearby wells or from the current well bore.

Another example of a method for evaluating drilling information to provide a solution to improve drilling performance follows. Specifically, in this hypothetical situation, a drilling operator in Argentina has experienced problems maintaining a vertical well during drilling. The rock hardness of the formation in the area requires a high WOB to drill efficiently with the drilling tool assembly used by the drilling operator. It is also known that the formation dips at a 25 degree angle, which contributes to the difficulty in maintaining a vertical well. Starting at 2,500 feet, the drilling operator wants to drill a 16 inch diameter section to 5,000 feet while maintaining an inclination of less than 5 degrees The first step is to obtain drilling information from an offset well. The WOB used previously is 80,000 lbs. The rock strength is 20,000 pounds per square inch. The formation geometry is defined to have a dip angle of 25 degrees and the strike angle of 200 degrees. The dip angle is the magnitude of the inclination of the formation from horizontal. The strike angle is the azimuth of the intersection of a plane with a horizontal surface. Other drilling operating parameters and well bore parameters are also obtained. For the purposes of calibrating the model and having a baseline for potential solutions, a drilling simulation using the drilling information and the previously used drilling tool assembly is performed.

Figure 13B:
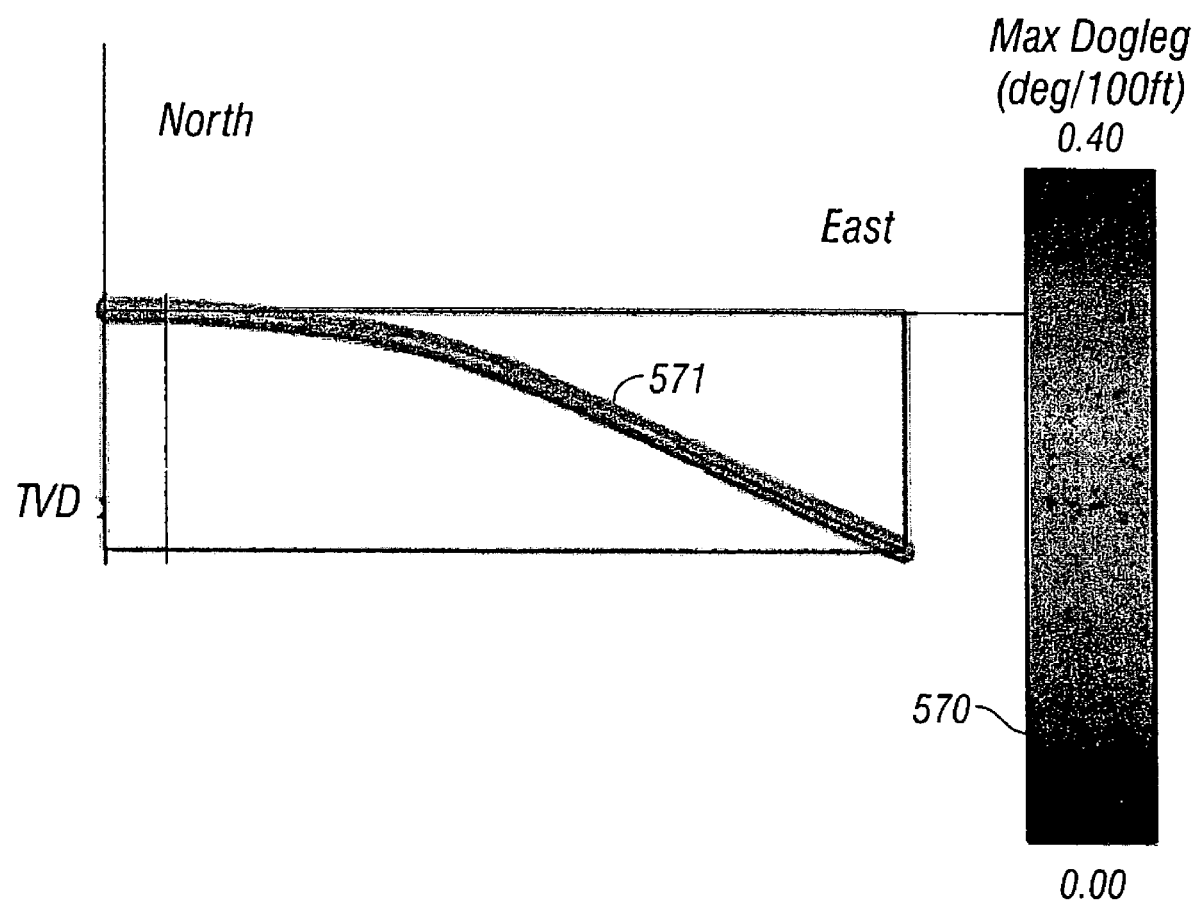
FIG. 13B shows a graphical visualization of a well bore in accordance with one embodiment of the present invention.
Figure 14:
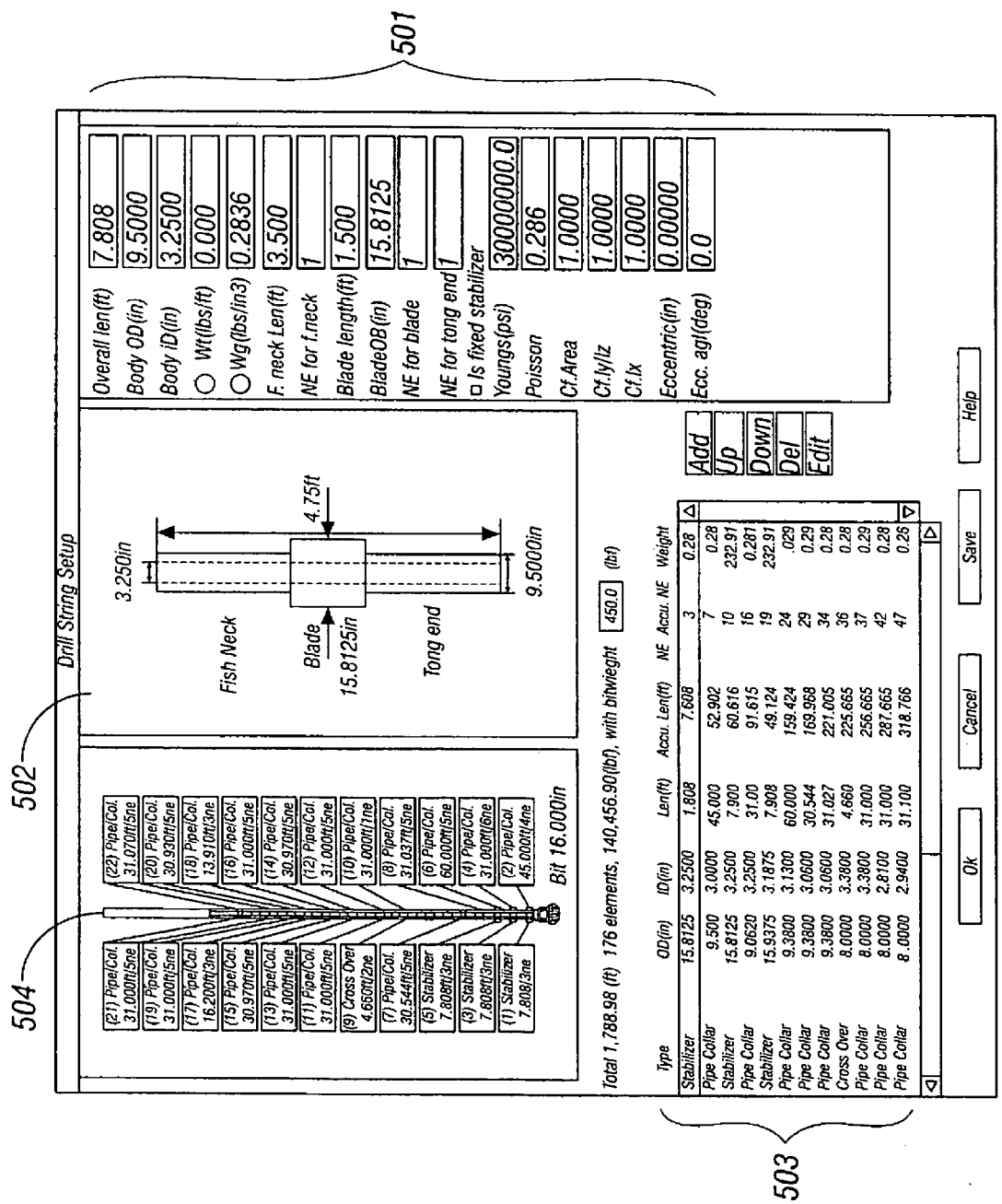
FIG. 14 shows an input screen for a drilling simulation in accordance with one embodiment of the present invention.

The offset well information is entered into a simulation program to define the environment for the drilling simulation. The well bore is modeled in increments by inputting well survey data from the offset well, as shown in FIG. 13. The well survey data is entered to 4,400 feet. A 3-D graphical visualization of the modeled well bore is shown in FIG. 14. A scale 570 is used to quantify the dogleg severity of the well bore 571. Based on the known drilling information, anisotropy indexes are calculated for the formation for use in the drilling simulation.

Figures 15, 16:
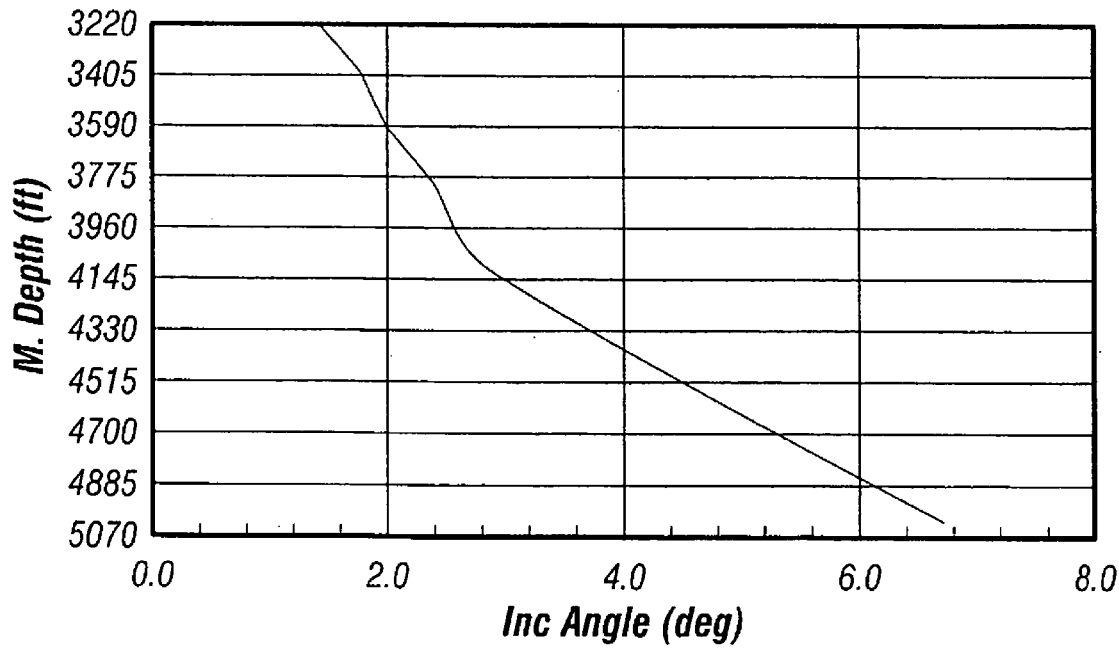
FIG. 15 shows a tabular output of a drilling simulation in accordance with one embodiment of the present invention.
FIG. 16 shows a graphical visualization of a drilling performance parameter from a drilling simulation in accordance with one embodiment of the present invention.

The drilling tool assembly that was previously used by the drilling operator is also modeled. The input screen for the previously used drilling tool assembly is shown in FIG. 14. After modeling the well bore and drilling tool assembly, a drilling simulation is performed from 4,300 feet to 4,400 feet. The data at 4,400 feet is then compared to the actual offset well data to ensure accuracy in the model. FIG. 15 shows a tabular output of the well bore geometry from the drilling simulation. The data in FIG. 15 is compared to the previously entered offset well data in FIG. 13. The drilling simulation matches the offset well data, which indicated that the model is ready to be used for predictive purposes.

The data from the drilling simulation can then be used to predict the well bore that would be drilled by the previously used drilling tool assembly using the original drilling operating parameters. A prediction to 5,070 feet is shown in FIG. 16. FIG. 16 graphs depth versus inclination angle. The target is to be less than 5 degrees at 5,000 feet. The prediction from the drilling simulation shows that the well bore would have a 6.7 degree inclination at 5,000 feet, which means that potential solutions are needed by the drilling operator to drill the desired well bore.

The selected drilling performance criterion for the solution is to drill a well bore with an inclination of less than 5 degrees at 5,000 feet. One of ordinary skill in the art would appreciate that many potential solutions may exist that would be able to drill the well bore in the required manner. For simplicity, only two of the potential solutions are discussed. Potential solution A is to use the original 16 inch drill bit, 45 feet of 9½ inch drill collar, a 15.75" stabilizer, and then the original drilling tool assembly from component 6 and above as shown in the drilling tool assembly layout 504 in FIG. 14. Potential solution B is the original 16 inch drill bit, 45 feet of 11 inch drill collar, a 14.81" stabilizer, and then the original drilling tool assembly from component 6 and above as shown in the drilling tool assembly layout 504 in FIG. 14. Drilling simulations are performed for each of the potential solutions.

Figure 17A:
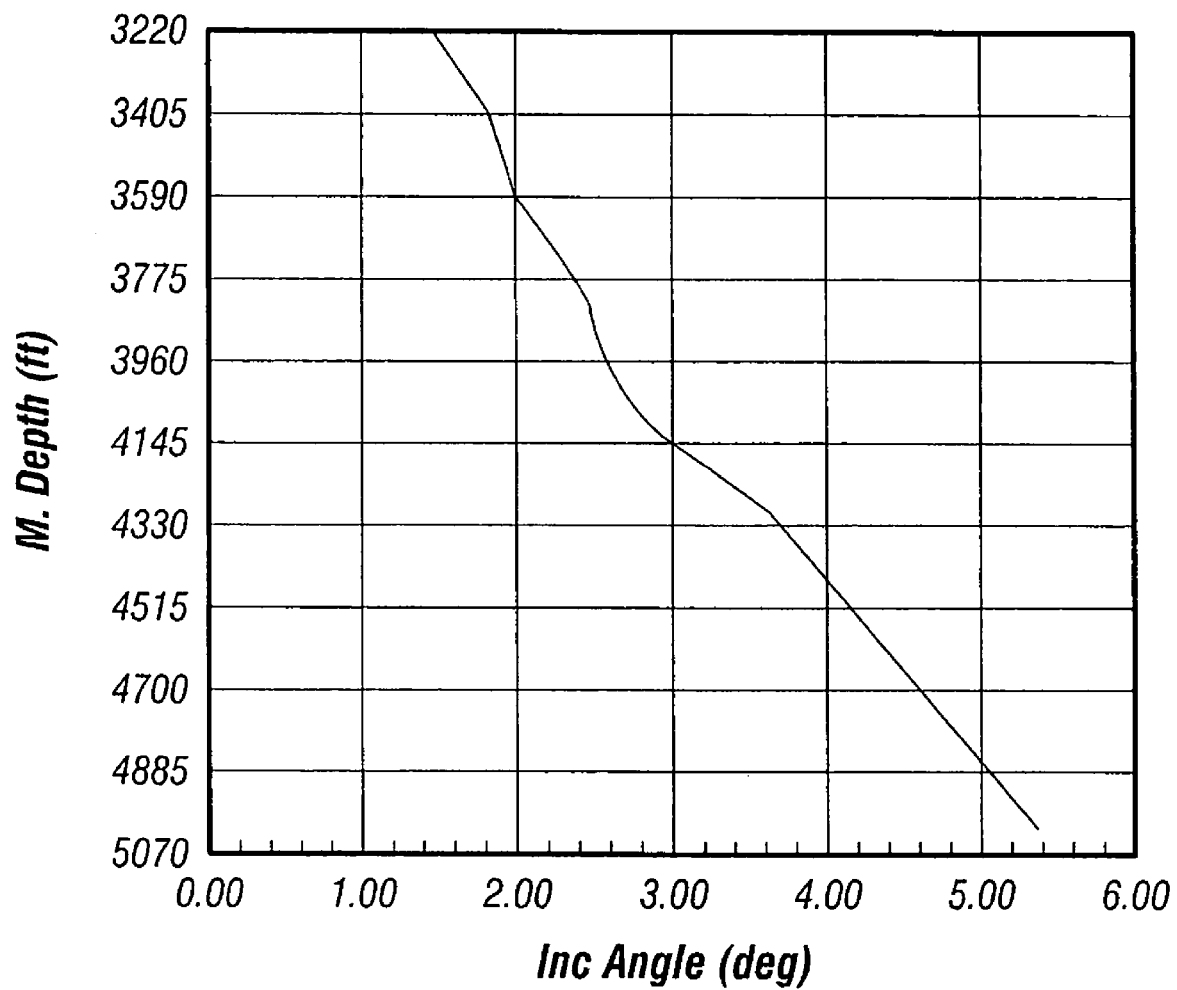
FIG. 17A shows a graphical visualization of a drilling performance parameter from a drilling simulation in accordance with one embodiment of the present invention.
Figure 17B:
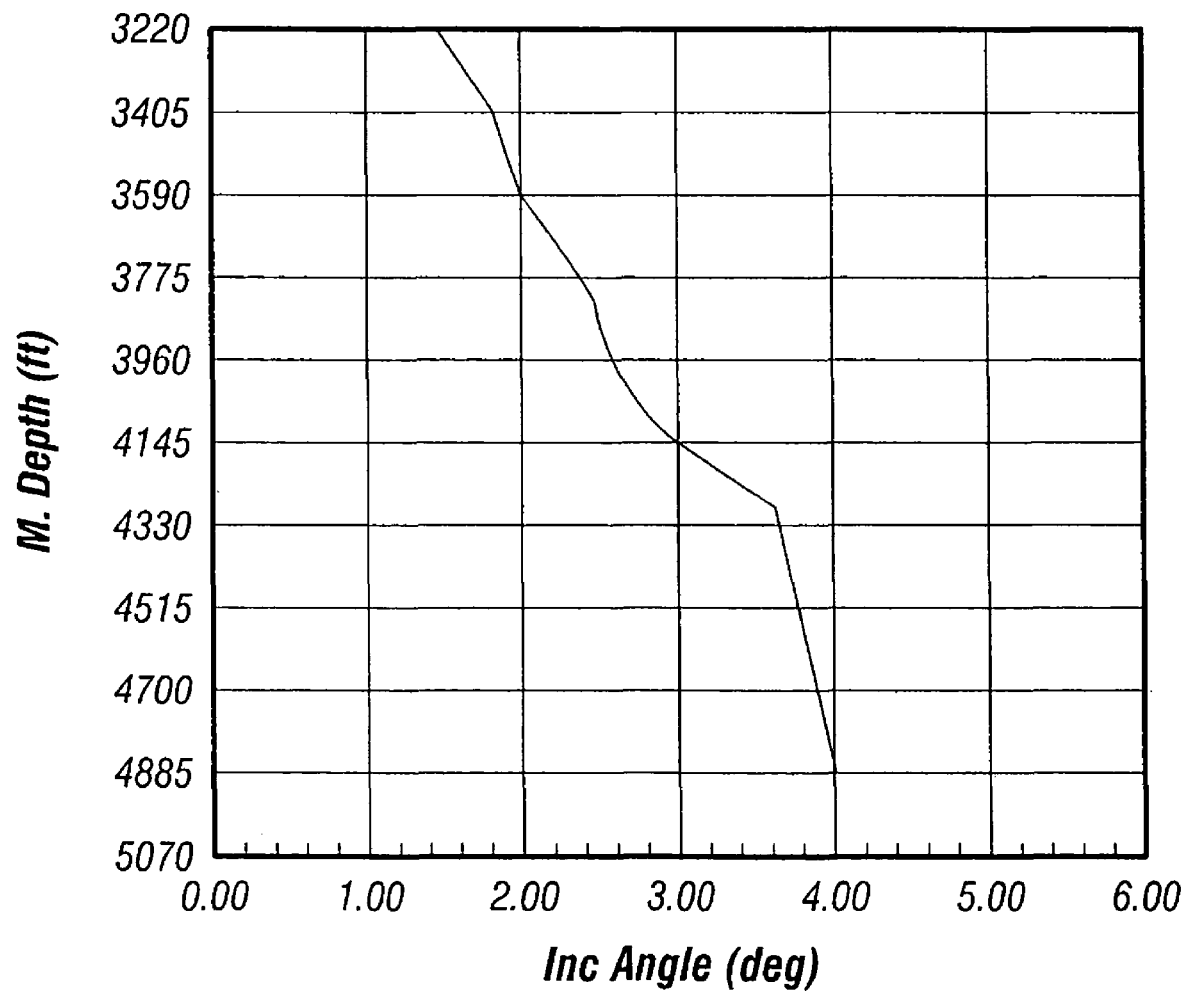
FIG. 17B shows a graphical visualization of a drilling performance parameter from a drilling simulation in accordance with one embodiment of the present invention.

After performing the drilling simulations, potential solution A and B are compared. In this example, plots of depth versus inclination angle are used. Those plots are shown in FIGS. 17A and 17B. FIG. 17A shows that potential solution A will result in an inclination of 5.4 degrees at 5,000 feet. This is an improvement over the original drilling tool assembly, but still greater than the desired inclination. FIG. 17B shows that potential solution B will achieve an inclination of 4.1 degrees at 5,000 feet. Potential solution B is the selected solution for the drilling operator.

While only two potential solutions were used in the above example, one of ordinary skill that additional potential solutions may be simulated. For example, different drill bits may have been potential solutions to the inclination of the well bore. Also, the drilling operator may have been concerned about ROP in addition to the inclination. In that case, additional comparisons of drilling performance criteria between potential solutions to select a solution. The selected solution may not be the best for ROP or inclination, but instead provide a balance of those drilling performance criteria.

Drilling trajectory prediction as described in the preceding example may be of great value in drilling a well. In one or more embodiments, an accurate drilling trajectory prediction may be used to reduce or eliminate the need for directional measuring systems during drilling. The requirement for repeated well surveys may also be reduced.

One of ordinary skill in the art will appreciate that a drilling performance problem may have many potential solutions. A potential solution may be adjusting the location of a single component, such as a stabilizer, in a drilling tool assembly. A potential solution may be to use a different drill bit with a previously used drilling tool assembly. In some embodiments, a potential solution may be an entirely different drilling tool assembly. Alternatively, a potential solution may be to only adjust drilling operating parameters, such as RPM and WOB, to achieve the desired drilling performance. In other embodiments, a potential solution may be the addition or removal of a component in the drilling tool assembly. Examples of potential solutions are for illustrative purposes only, and are not intended to limit the scope of the invention.

Figure 18:
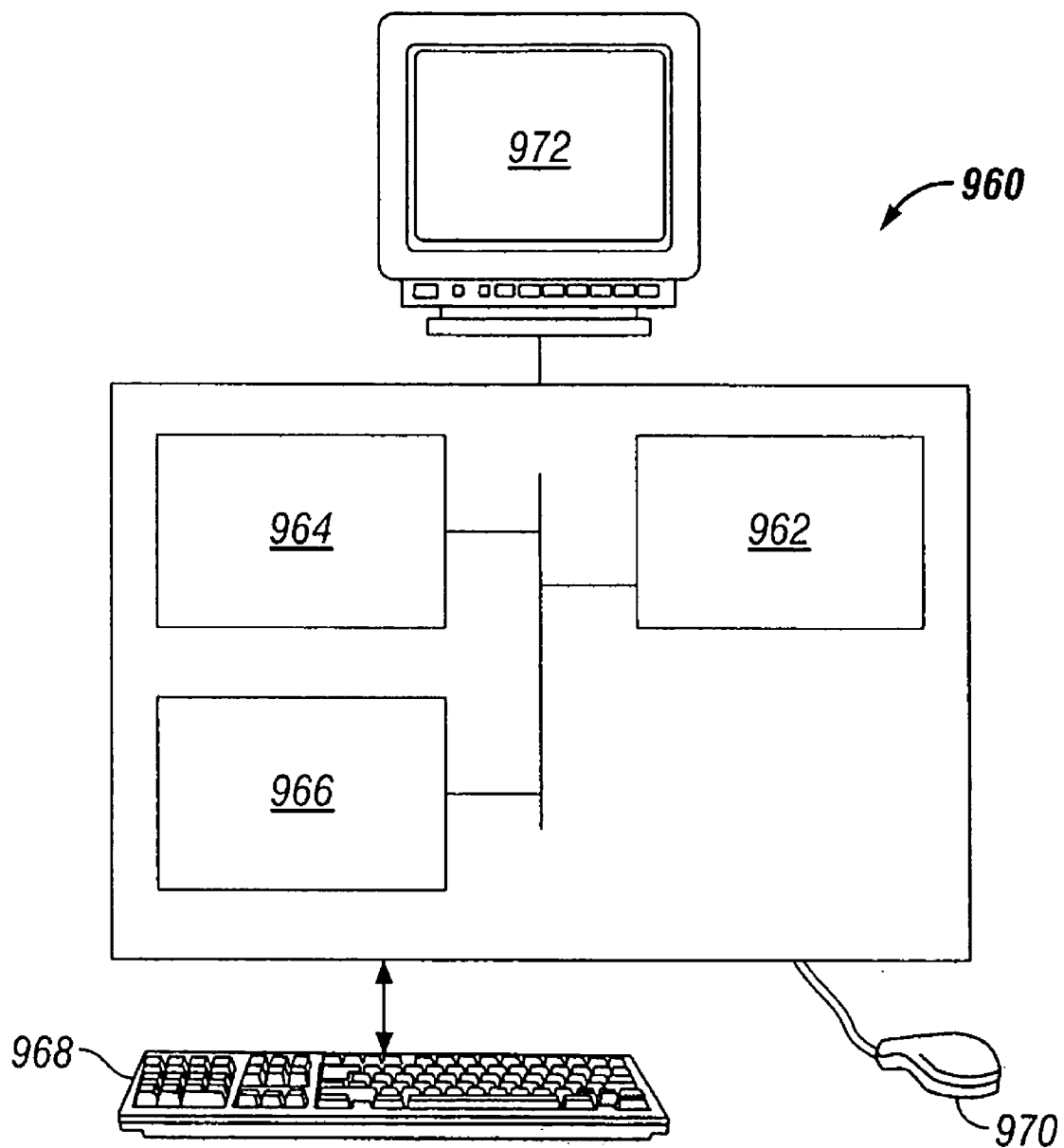
FIG. 18 shows a computer system in accordance with an embodiment of the invention.

Aspects of embodiments of the invention, such as the collection and evaluation of drilling data and the performance of dynamic simulations, may be implemented on any type of computer regardless of the platform being used. For example, as shown in FIG. 18, a networked computer system (960) that may be used in an embodiment of the invention includes a processor (962), associated memory (964), a storage device (966), and numerous other elements and functionalities typical of today's computers (not shown). The networked computer (960) may also include input means, such as a keyboard (968) and a mouse (970), and output means, such as a monitor (972). The networked computer system (960) is connected to a local area network (LAN) or a wide area network (e.g., the Internet) (not shown) via a network interface connection (not shown). Those skilled in the art will appreciate that these input and output means may take other forms. Additionally, the computer system may not be connected to a network. Further, those skilled in the art will appreciate that one or more elements of the aforementioned computer (960) may be located at a remote location and connected to the other elements over a network.

Embodiments of the invention may provide one or more of the following advantages. Embodiments of the invention may be used to evaluate drilling information to improve drilling performance in a given drilling operation. Embodiments of the invention may be used to identify potential causes of drilling performance problems based on drilling information. In some cases, causes of drilling performance problems may be confirmed performing drilling simulations. Additionally, in one or more embodiments, potential solutions to improve drilling performance may be defined, validated through drilling simulations, and selected based on one or more selected drilling performance criteria. Further, methods in accordance with one or more embodiments of the present invention may provide predictions for the drilling performance of a selected drilling tool assembly.

Further, it should be understood that regardless of the complexity of a drilling tool assembly or the trajectory of the well bore in which it is to be constrained, the invention provides reliable methods that can be used to determine a preferred drilling tool assembly design for drilling in a selected earth formation under defined conditions. The invention also facilitates designing a drilling tool assembly having enhanced drilling performance, and may be used determine optimal drilling operating parameters for improving the drilling performance of a selected drilling tool assembly.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of controlling a directional aspect of a drilling tool assembly comprising:
   (a) identifying a desired wellbore trajectory;
   (b) defining at least one potential solution to obtain the desired wellbore trajectory;
   (c) performing a drilling simulation of the at least one potential solution;
   (d) determining, based on the performing the drilling simulation, whether the simulated potential solution achieves the identified desired wellbore trajectory;
   (e) repeating steps (b)-(d) until the desired wellbore trajectory is achieved; and
   (f) outputting the solution that achieves the desired wellbore trajectory.

2. The method of claim 1, wherein the desired wellborn trajectory is defined by at least one of a build angle, a dogleg severity, and a walk rate.

3. The method of claim 1, further comprising calculating an anisotropy index of an earth formation and inputting the anisotropy index in the drilling simulation.

4. The method of claim 1, wherein the outputting comprises a graphical visualization of at least one of the drilling tool assembly, the earth formation, and the wellbore trajectory.

5. The method of claim 4, wherein the graphical visualization is a three-dimensional representation.

6. The method of claim 1, further comprising controlling a drilling tool assembly comprising the outputted solution.

7. The method of claim 6, wherein the controlling comprises using the drilling tool assembly to drill a well.

8. The method of claim 7, further comprising:
   obtaining post-run drilling information collected during the using the solution; and
   determining a degree to which the drilling performance parameter has improved.

9. A method for improving control of a drilling tool assembly drilling an earth formation comprising:
   simulating the drilling tool assembly drilling the earth formation;
   calculating, based on the simulating, at least one of a dogleg severity, a build angle, and a walk rate;
   determining a force required to generate the build angle, the dogleg severity, or the walk rate for the drilling tool assembly;

determining controllability of the drilling tool assembly based on the force required to generate the build angle, the dogleg severity, or the walk rate for the drilling tool assembly;

adjusting a component of the drilling tool assembly;

repeating the simulating, calculating, and determining for the adjusted drilling tool assembly;

comparing the controllability of the drilling tool assembly and the adjusted drilling tool assembly; and outputting a drilling tool assembly design based on the controllability.

10. The method of claim 9, wherein the outputting comprises a graphical visualization of drilling tool assembly.

11. The method of claim 10, further comprising outputting a graphical visualization of at least one of the drilling tool assembly drilling the earth formation and the wellbore trajectory.

12. The method of claim 9, wherein the simulating models the drilling tool assembly drilling the earth formation in increments of time.

13. The method of claim 12, wherein the simulating models the drilling tool assembly drilling the earth formation in increments of depth.

14. The method of claim 9, further comprising inputting geological information, wherein the geological information comprises well survey data from offset wells.

15. A method for designing a drilling tool assembly with a desired walk rate comprising:

simulating the drilling tool assembly drilling the earth formation;

calculating a walk rate of the drilling tool assembly;

comparing the calculated walk rate with a desired walk rate;

adjusting a component of a drilling tool assembly based on the comparing;

repeating the simulating, calculating, comparing, and adjusting until the calculated walk rate achieves the desired walk rate; and outputting the drilling tool configuration that corresponds to the desired walk rate.

16. The method of claim 15, wherein the simulating comprises defining at least one of a rate of penetration and a revolution per minute of the drilling tool assembly in the earth formation.

17. The method of claim 15, wherein the adjusting a component comprises adjusting a location of a component of the drilling tool assembly on the drilling tool assembly.

18. The method of claim 15, further comprising modeling the drilling tool assembly and the earth formation.

19. The method of claim 18, wherein the modeling of the earth formation is generated in increments of depth.

20. The method of claim 18, wherein the modeling of the earth formation is generated in increments of time.

* * * * *